US012696608B2

(12) United States Patent
Yang et al.

(10) Patent No.: US 12,696,608 B2
(45) Date of Patent: Jul. 28, 2026

(54) ELECTRONIC DEVICE HAVING PHOTO DIODE AND LIGHT EMITTING MODULE

(71) Applicant: Innolux Corporation, Miaoli County (TW)

(72) Inventors: Chiu-Lien Yang, Miaoli County (TW);
Jia-Yuan Chen, Miaoli County (TW);
Chandra Lius, Miaoli County (TW);
Tsung-Han Tsai, Miaoli County (TW);
Kuan-Feng Lee, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 571 days.

(21) Appl. No.: 18/166,483

(22) Filed: Feb. 9, 2023

(65) Prior Publication Data

US 2023/0282676 A1     Sep. 7, 2023

(30) Foreign Application Priority Data

Mar. 7, 2022     (CN) .......................... 202210225607.4

(51) Int. Cl.
H10H 29/45 (2025.01)
G02B 3/00 (2006.01)
(Continued)

(52) U.S. Cl.
CPC ........... H10H 29/45 (2025.01); G02B 3/0006 (2013.01); H10F 39/182 (2025.01);
(Continued)

(58) Field of Classification Search
CPC ........ H10K 59/60; H10K 59/65; H10H 29/32; H10H 29/142; H10H 29/30; H10H 29/37; H10H 29/39; H10F 39/182; H10F 39/8057
See application file for complete search history.

(56) References Cited

U.S. PATENT DOCUMENTS

2006/0011913 A1*   1/2006   Yamazaki ............. G06F 3/0412
                                                                    257/53
2015/0331508 A1    11/2015   Nho et al.
                         (Continued)

FOREIGN PATENT DOCUMENTS

CN         107068716         8/2017
CN         108346684         7/2018
                    (Continued)

OTHER PUBLICATIONS

"Office Action of Taiwan Counterpart Application", issued on Sep. 5, 2023, p. 1-p. 7.
(Continued)

*Primary Examiner* — Aaron J Gray
(74) *Attorney, Agent, or Firm* — JCIPRNET

(57) ABSTRACT
An electronic device and a method of manufacturing the electronic device are provided. The electronic device includes a semiconductor substrate and a light emitting module. The semiconductor substrate includes multiple transistors and multiple photo diodes. The light emitting module is disposed on the semiconductor substrate and includes multiple light emitting elements. The light emitting elements are respectively electrically connected to the transistors, and the light emitting elements do not overlap with the photo diodes.

3 Claims, 18 Drawing Sheets

(51) Int. Cl.

| | | |
|---|---|---|
| *H10D 62/13* | (2025.01) | |
| *H10F 39/00* | (2025.01) | |
| *H10F 39/18* | (2025.01) | |
| *H10H 29/14* | (2025.01) | |
| *H10H 29/32* | (2025.01) | |
| *H10H 29/39* | (2025.01) | |

(52) U.S. Cl.
CPC ....... *H10F 39/8057* (2025.01); *H10H 29/142* (2025.01); *H10H 29/32* (2025.01); *H10H 29/39* (2025.01); *H10D 62/133* (2025.01)

(56) References Cited

U.S. PATENT DOCUMENTS

| | | |
|---|---|---|
| 2018/0019233 A1 | 1/2018 | Chang et al. |
| 2018/0060641 A1* | 3/2018 | Kim ................... G06V 40/1335 |
| 2019/0051709 A1* | 2/2019 | Puszka ................... H10K 59/38 |
| 2021/0202620 A1* | 7/2021 | Feng .................... H10K 59/122 |

FOREIGN PATENT DOCUMENTS

| | | |
|---|---|---|
| CN | 109390371 | 2/2019 |
| CN | 113130602 | 7/2021 |
| TW | 201928479 | 7/2019 |
| TW | 201937401 | 9/2019 |
| TW | 202001365 | 1/2020 |

OTHER PUBLICATIONS

"Office Action of China Counterpart Application", issued on May 15, 2026, p. 1-p. 10.

* cited by examiner

ELECTRONIC DEVICE HAVING PHOTO DIODE AND LIGHT EMITTING MODULE

CROSS-REFERENCE TO RELATED APPLICATION

This application claims the priority benefit of China application serial no. 202210225607.4, filed on Mar. 7, 2022. The entirety of the above-mentioned patent application is hereby incorporated by reference herein and made a part of this specification.

BACKGROUND

Technical Field

The disclosure relates to an electronic device.

Description of Related Art

The conventional electronic device is integrated with a sensing module therein to provide an identity recognition (for example, fingerprint sensing) function. However, the current practice requires additional fabrication of an optical structure corresponding to the sensing module, resulting in an increase in the manufacturing procedure.

SUMMARY

The disclosure provides an electronic device with a relatively simplified manufacturing procedure.

According to an embodiment of the disclosure, the electronic device includes a semiconductor substrate and a light emitting module. The semiconductor substrate includes multiple transistors and multiple photo diodes. The light emitting module is disposed on the semiconductor substrate and includes multiple light emitting elements. The light emitting elements are respectively electrically connected to the transistors, and the light emitting elements do not overlap with the photo diodes.

According to another embodiment of the disclosure, the electronic device includes a semiconductor substrate and a light emitting module. The semiconductor substrate includes multiple first transistors. The light emitting module is disposed on the semiconductor substrate and includes multiple light emitting elements and multiple photo diodes. The light emitting elements are respectively electrically connected to the first transistors, and the photo diodes do not overlap with the light emitting elements.

According to yet another embodiment of the disclosure, a method of manufacturing an electronic device includes the following steps. A semiconductor substrate is provided. The semiconductor substrate includes multiple transistors and multiple photo diodes. A light emitting module is provided. The light emitting module includes multiple light emitting elements. The light emitting module is disposed on the semiconductor substrate, so that the light emitting elements are respectively electrically connected to the transistors, and the light emitting elements do not overlap with the photo diodes.

In order for the features and advantages of the disclosure to be more obvious and conceivable, the following embodiments are given and described in detail with reference to the drawings as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
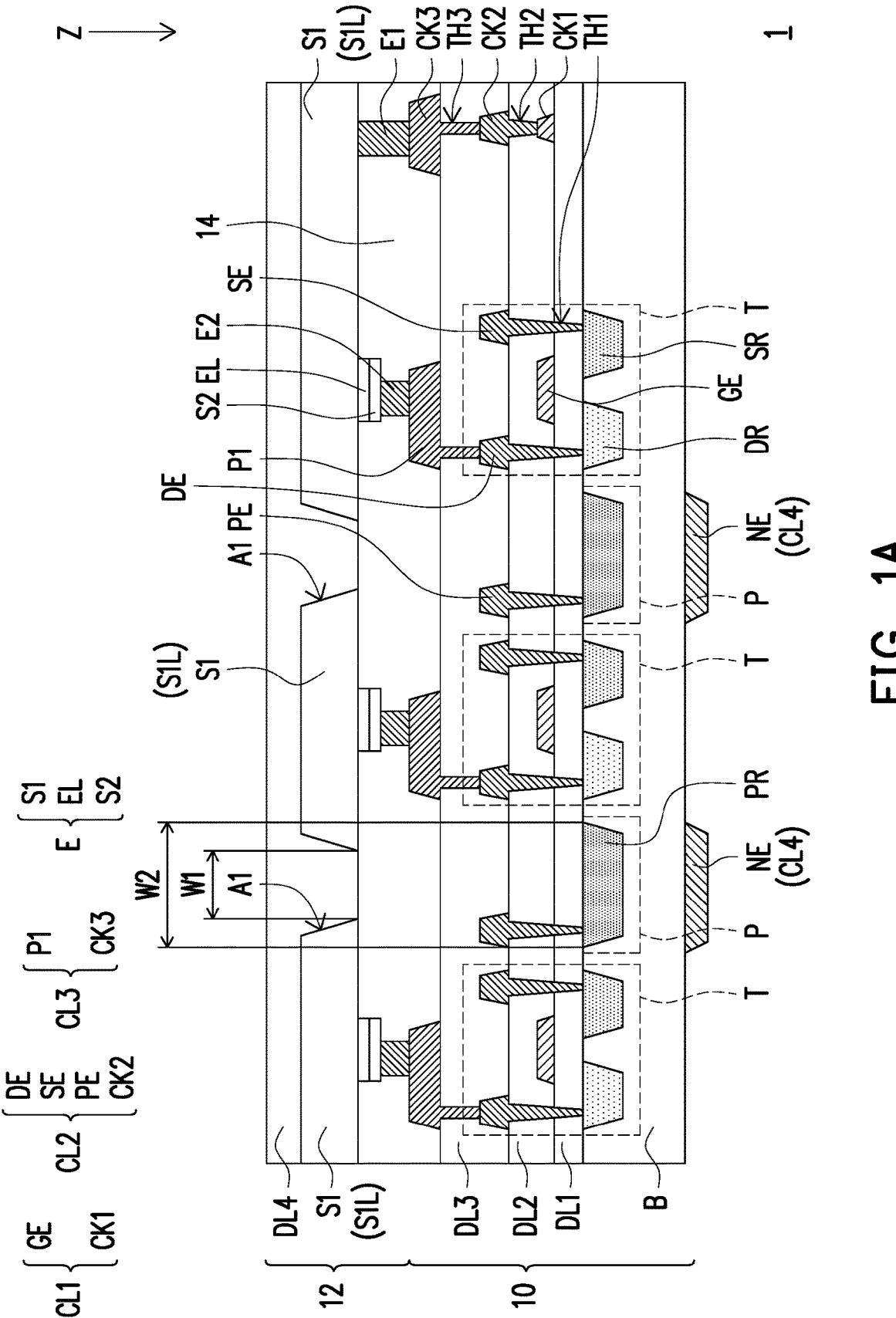
FIG. 1A, FIG. 2, FIG. 3, FIG. 4A, FIG. 5 to FIG. 9, FIG. 12B, and FIG. 13B are respectively partial cross-sectional schematic views of an electronic device according to multiple embodiments of the disclosure.

Reference will now be made in detail to the exemplary embodiments of the disclosure, examples of which are illustrated in the drawings. Wherever possible, the same reference numerals are used in the drawings and description to refer to the same or similar parts.

Throughout the disclosure and the appended claims, certain terms may be used to refer to specific elements. It should be understood by persons skilled in the art that electronic device manufacturers may refer to the same element by different names. The disclosure does not intend to distinguish between elements with the same function but different names. In the following description and claims, words such as "containing" and "comprising" are open-ended words, so the words should be interpreted as "including but not limited to . . . ".

Directional terms, such as "upper", "lower", "front", "rear", "left", and "right", mentioned in the disclosure are only directions with reference to the drawings. Accordingly, the used directional terms are used to illustrate, but not to limit, the disclosure. In the drawings, each drawing illustrates the general characteristics of a method, a structure, and/or material used in a specific embodiment. However, the drawings should not be construed to define or limit the scope or nature covered by the embodiments. For example, the relative sizes, thicknesses, and positions of various film layers, regions, and/or structures may be reduced or enlarged for clarity.

When a structure (or layer, element, substrate) is described in the disclosure as being located on/over another structure (or layer, element, substrate), it may mean that the two structures are adjacent and directly connected or it may mean that the two structures are adjacent but not directly connected. Indirect connection means that there is at least one intermediate structure (or intermediate layer, intermediate element, intermediate substrate, intermediate spacing) between the two structures, wherein the lower surface of one structure is adjacent to or directly connected to the upper surface of the intermediate structure, and the upper surface of the other structure is adjacent to or directly connected to the lower surface of the intermediate structure. The intermediate structure may be composed of a single-layer or multi-layer physical structure or non-physical structure, which is not limited. In the disclosure, when a certain structure is disposed "on" another structure, it may mean that the certain structure is "directly" on another structure or it may mean that the certain structure is "indirectly" on another structure, that is, at least one structure is also sandwiched between the certain structure and another structure.

The terms "about", "equal to", "equivalent" or "same", "substantially", or "roughly" are generally interpreted as within 20% of a given value or range or interpreted as within 10%, 5%, 3%, 2%, 1%, or 0.5% of the given value or range.

Terms such as "first" and "second" used in the description and claims are used to modify elements, and the terms do not imply and represent that the element(s) have any previous ordinal numbers, nor do they represent the order of a certain element and another element or the order of a manufacturing method. The use of the ordinal numbers is only used to clearly distinguish between an element with a certain name and another element with the same name. The claims and description may not use the same terms, whereby a first element in the specification may be a second element in the claims.

Electrical connection or coupling described in the disclosure may refer to direct connection or indirect connection. In the case of direct connection, terminals of elements on two circuits are directly connected or connected to each other by a conductor segment. In the case of indirect connection, there is a switch, a diode, a capacitor, an inductor, a resistor, other suitable elements, or a combination of the above elements between the terminals of the elements on the two circuits, but not limited thereto.

In the disclosure, the measurement manner of thickness, length, and width may be by adopting an optical microscope, and the thickness or the width may be measured by a cross-sectional image in an electron microscope, but not limited thereto. In addition, there may be a certain error in any two values or directions used for comparison. Additionally, the terms "equal to," "equivalent," "same," "substantially," or "roughly" mentioned in the disclosure generally mean within 10% of a given value or range. Furthermore, the phrases "the given range is from a first value to a second value" and "the given range falls within the range of the first value to the second value" mean that the given range includes the first value, the second value, and other values in between. If a first direction is perpendicular to a second direction, an angle between the first direction and the second direction may be between 80 degrees and 100 degrees; and if the first direction is parallel to the second direction, the angle between the first direction and the second direction may be between 0 degrees and 10 degrees.

It should be noted that in the following embodiments, the features of several different embodiments may be replaced, recombined, and mixed to complete other embodiments without departing from the spirit of the disclosure. As long as the features of the embodiments do not violate the spirit of the invention or conflict with each other, the features may be arbitrarily mixed and matched.

Unless otherwise defined, all terms (including technical and scientific terms) used herein have the same meaning as commonly understood by persons skilled in the art to which the disclosure belongs. It is understood that the terms, such as the terms defined in commonly used dictionaries, should be interpreted as having meanings consistent with the relevant art and the background or context of the disclosure, and should not be interpreted in an idealized or overly formal manner, unless otherwise defined in the embodiments of the disclosure.

In the disclosure, an electronic device may include a display device, a backlight device, an antenna device, a sensing device, or a splicing device, but not limited thereto. The electronic device may be a bendable or flexible electronic device. The display device may be a non-self-luminous display device or a self-luminous display device. The antenna device may be a liquid crystal antenna device or a non-liquid crystal antenna device, and the sensing device may be a sensing device for sensing capacitance, light, heat, or ultrasonic waves, but not limited thereto. In the disclosure, an electronic element may include a passive element and an active element, such as a capacitor, a resistor, an inductor, a diode, and a transistor. The diode may include a light emitting diode or a photo diode. The light emitting diode may include, for example, an organic light emitting diode (OLED), a mini LED, a micro LED, or a quantum dot LED, but not limited thereto. The splicing device may be, for example, a display splicing device or an antenna splicing device, but not limited thereto. It should be noted that the electronic device may be any combination of the above, but not limited thereto. Hereinafter, the disclosure will be described by using the display device as the electronic device or the splicing device, but the disclosure is not limited thereto.

It should be noted that the technical solutions provided by the different embodiments hereinafter may be replaced, combined, or used in combination to constitute another embodiment without violating the spirit of the disclosure.

Figure 10A:
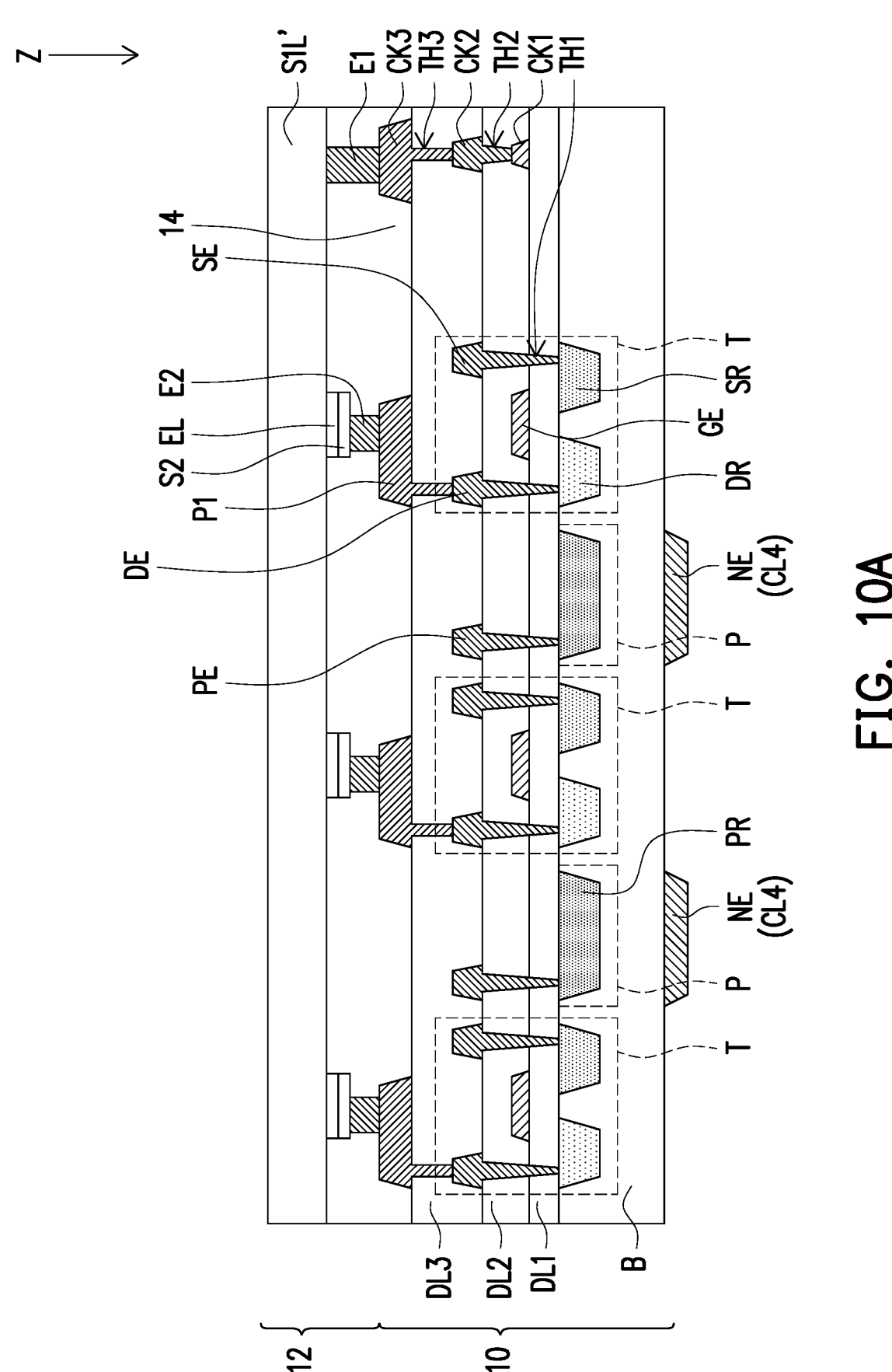
FIG. 10A and FIG. 10B are partial cross-sectional schematic views of a manufacturing process of an electronic device according to a first embodiment of the disclosure.
Figure 10B:
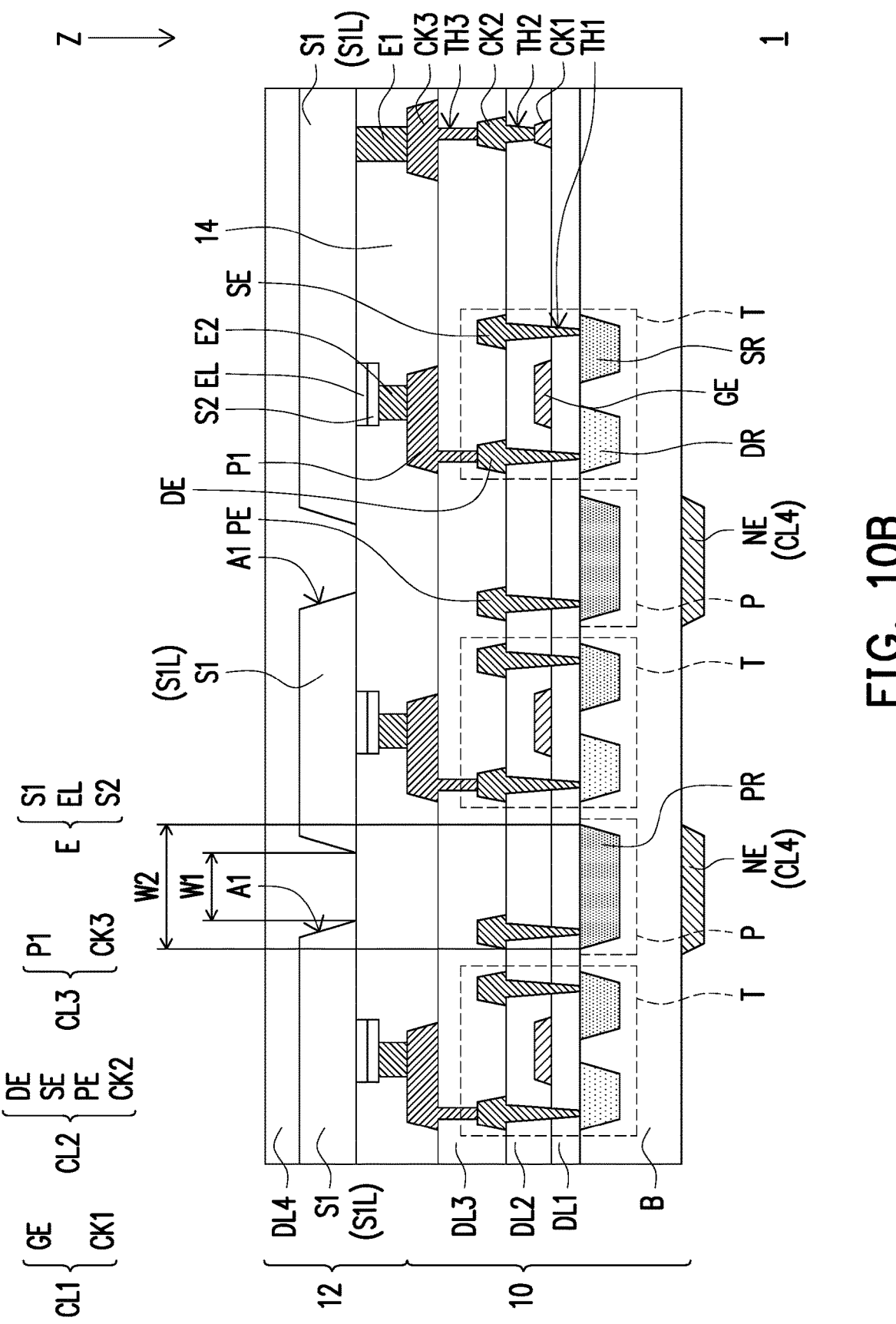
Figure 11A:
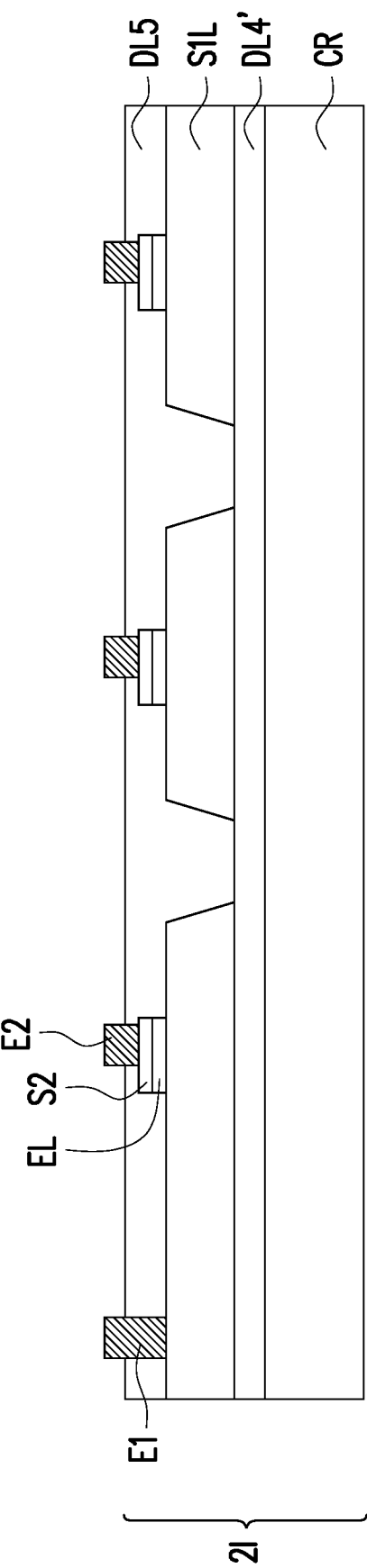
FIG. 11A and FIG. 11B are partial cross-sectional schematic views of a manufacturing process of an electronic device according to a tenth embodiment of the disclosure.
Figure 11B:
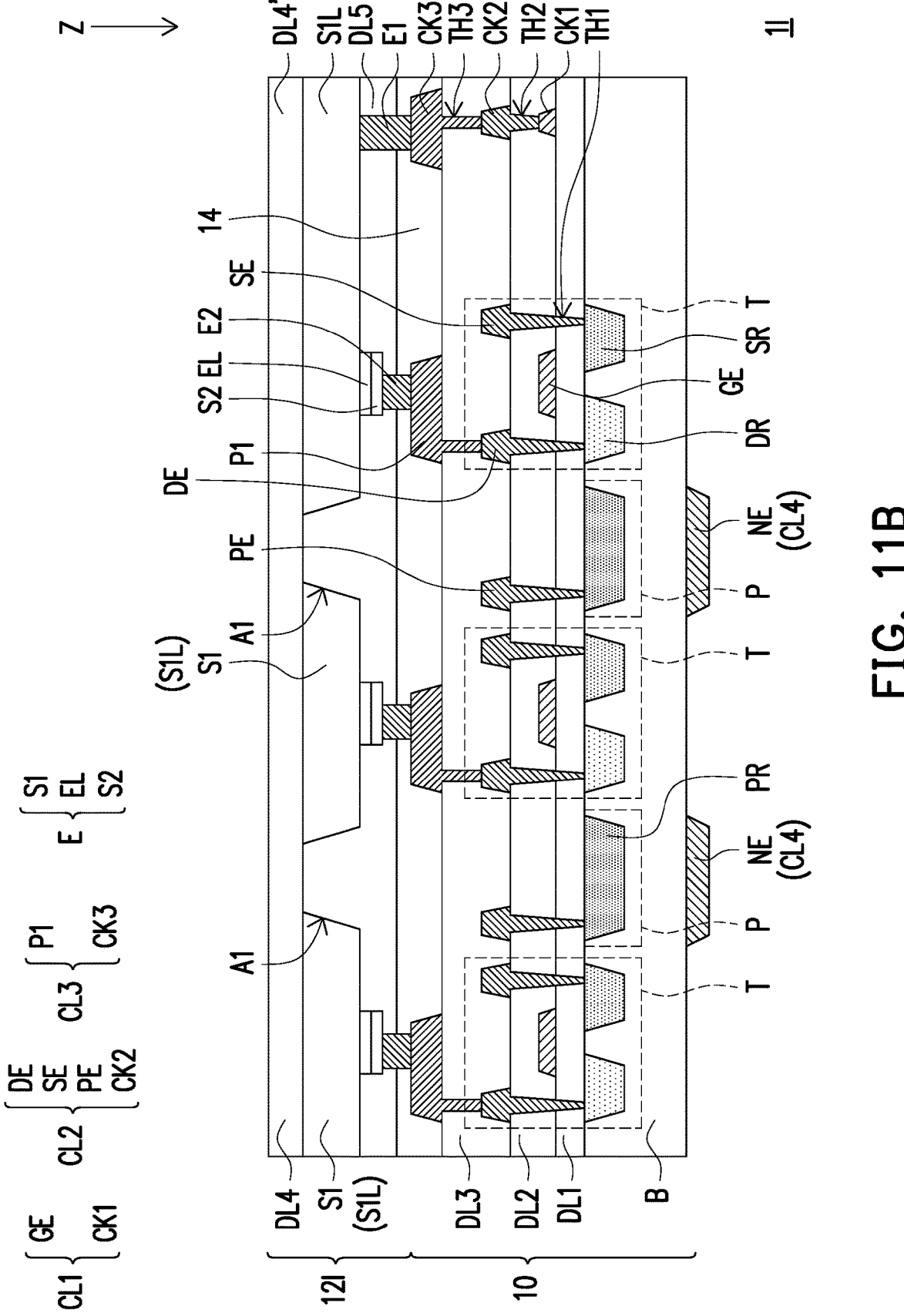
Figure 12A:
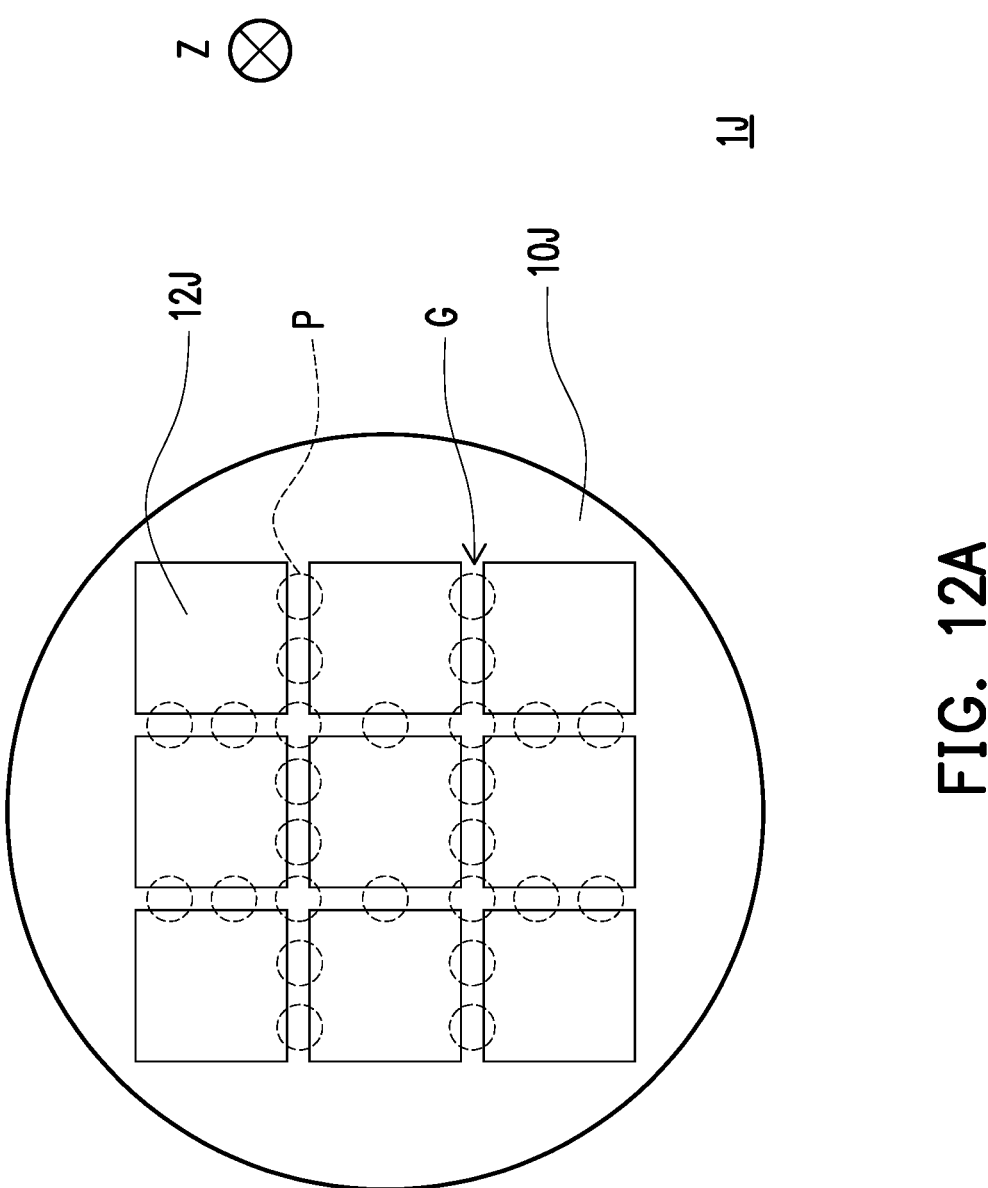
FIG. 12A is a schematic top view of the electronic device in FIG. 12B.

FIG. 1A, FIG. 2, FIG. 3, FIG. 4A, FIG. 5 to FIG. 9, FIG. 12B, and FIG. 13B are respectively partial cross-sectional schematic views of an electronic device according to multiple embodiments of the disclosure. FIG. 1B is a partial top schematic view of a first type semiconductor layer in FIG. 1A. FIG. 4B is a partial top schematic view of the electronic device in FIG. 4A. FIG. 10A and FIG. 10B are partial cross-sectional schematic views of a manufacturing process of an electronic device according to a first embodiment of the disclosure. FIG. 11A and FIG. 11B are partial cross-sectional schematic views of a manufacturing process of an electronic device according to a tenth embodiment of the disclosure. FIG. 12A is a schematic top view of the electronic device in FIG. 12B. FIG. 13A is a schematic top view of the electronic device in FIG. 13B.

Figure 1B:
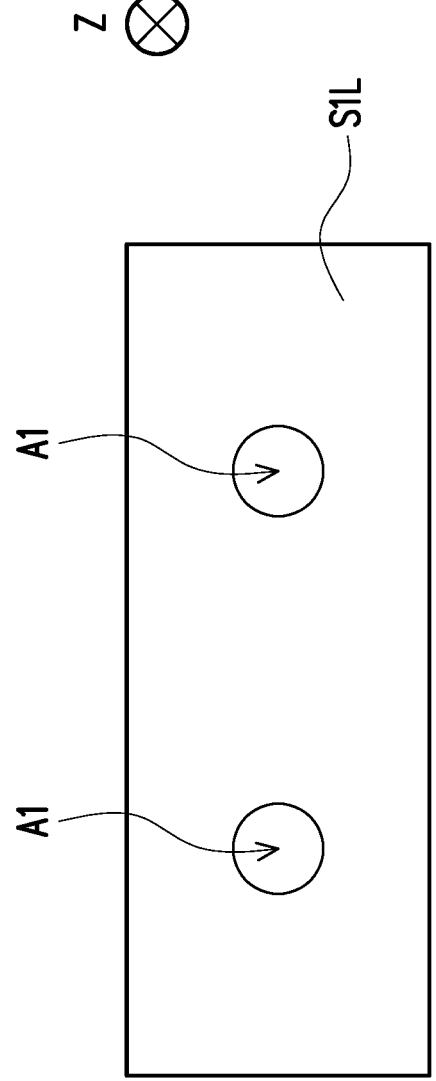
FIG. 1B is a partial top schematic view of a first type semiconductor layer in FIG. 1A.

Please refer to FIG. 1A. An electronic device 1 may include a semiconductor substrate and a light emitting module 12. The semiconductor substrate 10 includes multiple transistors T and multiple photo diodes P. The light emitting module 12 is disposed on the semiconductor substrate 10 and includes multiple light emitting elements E. The light emitting elements E are respectively electrically connected to the transistors T, and the light emitting elements E do not overlap with the photo diodes P. Herein, the overlapping/non-overlapping of two elements refers to the overlapping/non-overlapping of the two elements in a normal direction of a surface of the semiconductor substrate 10 or a top view direction (for example, a direction Z) of the electronic device 1.

In some embodiments, the semiconductor substrate 10 further includes a base B. The material of the base B may include a semiconductor material, such as monocrystalline silicon, polycrystalline silicon, silicon carbide (SiC), silicon (Si), germanium (Ge), gallium arsenide (GaAs), indium phosphide (InP), or gallium nitride (GaN), but not limited thereto.

The photo diode P is, for example, a light sensitive semiconductor element that is formed in the base B through an ion implantation process and may sense a light beam. In some embodiments, the base B may be an N-type silicon substrate, a P-type doped region PR may be formed in the base B through an ion implantation process, and the photo diode P may include the P-type doped region PR and a photo diode composed of a partial N-type silicon substrate, but not limited thereto. During an exposure stage, the photo diode P provides a signal through a P-type electrode PE and an N-type electrode NE, so that the photo diode P is in a reverse bias voltage. When light reflected from a test specimen is received, a photocurrent is generated, and an external circuit achieves a sensing function through reading the photocurrent.

In addition to the P-type doped region PR, a source region SR and a drain region DR may also be formed in the base B through an ion implantation process. FIG. 1A schematically shows two P-type doped regions PR, three source regions SR, and three drain regions DR. However, it should be understood that the number of each of the P-type doped region PR, the source region SR, and the drain region DR in the base B or the relative configuration relationship of the above elements may be changed according to requirements and is not limited to as shown in FIG. 1A.

According to different requirements, the semiconductor substrate 10 may further include other film layers. For example, the semiconductor substrate 10 may further include a dielectric layer DL1, a conductive layer CL1, a dielectric layer DL2, a conductive layer CL2, a dielectric layer DL3, a conductive layer CL3, and a conductive layer CL4, but not limited thereto.

The dielectric layer DL1 is disposed on the base B and covers the P-type doped region PR, the source region SR, and the drain region DR. The material of the dielectric layer DL1 may include an inorganic material, such as silicon oxide (SiOx) or silicon nitride (SiNx), but not limited thereto.

The conductive layer CL1 is disposed on the dielectric layer DL1. The material of the conductive layer CL1 may include a metal or a metal laminate, such as aluminum, copper, molybdenum, titanium, or a combination thereof, but not limited thereto. The conductive layer CL1 may be a patterned conductive layer, and the conductive layer CL1 may include a gate GE and other circuits (for example, a circuit CK1), but not limited thereto.

The dielectric layer DL2 is disposed on the dielectric layer DL1 and covers the conductive layer CL1. The material of the dielectric layer DL2 may include an inorganic material, such as silicon oxide or silicon nitride, but not limited thereto.

The conductive layer CL2 is disposed on the dielectric layer DL2. The material of the conductive layer CL2 may include a metal or a metal laminate, such as aluminum, copper, molybdenum, titanium, or a combination thereof, but not limited thereto. The conductive layer CL2 may be a patterned conductive layer, and the conductive layer CL2 may include a source SE, a drain DE, a P-type electrode PE, and other circuits (for example, a circuit CK2), but not limited thereto. The source SE may be electrically connected to the corresponding source region SR through a through hole TH1 penetrating the dielectric layer DL1 and the dielectric layer DL2. The drain DE may be electrically connected to the corresponding drain region DR through the corresponding through hole TH1. The P-type electrode PE may be electrically connected to the corresponding P-type doped region PR through the corresponding through hole TH1. The circuit CK2 may be electrically connected to the circuit CK1 through a through hole TH2 penetrating the dielectric layer DL2. The transistor T may be, for example, composed of a source region SR, a drain region DR, a gate GE, a source SE, and a drain DE, but not limited thereto.

The dielectric layer DL3 is disposed on the dielectric layer DL2 and covers the conductive layer CL2. The material of the dielectric layer DL3 may include an inorganic material, such as silicon oxide or silicon nitride, but not limited thereto.

The conductive layer CL3 is disposed on the dielectric layer DL3. The material of the conductive layer CL3 may include a metal or a metal laminate, such as aluminum, copper, molybdenum, titanium, or a combination thereof, but not limited thereto. The conductive layer CL3 may be a patterned conductive layer, and the conductive layer CL3 may include a pad P1 and other circuits (for example, a circuit CK3), but not limited thereto. The pad P1 may be electrically connected to the corresponding drain DE through a through hole TH3 penetrating the dielectric layer DL3. The circuit CK3 may be electrically connected to the circuit CK2 through the corresponding through hole TH3.

The conductive layer CL4 is disposed on a surface of the base B away from the P-type doped region PR. The material of the conductive layer CL4 may include a metal or a metal laminate, such as aluminum, copper, molybdenum, titanium, or a combination thereof, but not limited thereto. The conductive layer CL4 may be a patterned conductive layer, and the conductive layer CL4 may include an N-type electrode NE. The N-type electrode NE is, for example, located below the P-type doped region PR.

In some embodiments, as shown in FIG. 1A and FIG. 1B, the light emitting elements E include multiple first type semiconductors S1. The first type semiconductors S1 are integrated into a first type semiconductor layer S1L, and the first type semiconductor layer S1L includes multiple first openings A1. The first openings A1 respectively overlap with the photo diodes P. Although FIG. 1B shows that the top view shape of the first opening A1 is a circle, it should be understood that the top view shape of the first opening A1 may be changed to a quadrangle or other polygons according to requirements.

Through forming the first openings A1 overlapping with the photo diodes P in the first type semiconductor layer S1L, an interface reflection/refraction caused by the difference in refractive index can be reduced, thereby increasing the amount of light received by the photo diode P to improve signal interpretation accuracy.

In some embodiments, an area or a cross-sectional width W1 of each first opening A1 (for example, a bottom width/minimum width of the first opening A1) may be designed to be less than an area or a cross-sectional width W2 of the overlapping photo diode P (for example, the top width/maximum width of the photo diode P) to reduce noise.

According to different requirements, the light emitting elements E may further include multiple light emitting layers EL and multiple second type semiconductors S2, but not limited thereto.

The light emitting layers EL are disposed on a surface of the first type semiconductor layer S1L facing the semiconductor substrate 10, and each light emitting layer EL may include a multiple quantum well layer, but not limited thereto. The range or the area of the light emitting element E may be defined by the top view range or the top view area (the top area) of the light emitting layer EL. Similarly, the range or the area of the photo diode P may be defined by the top view range or the top view area (the top area) of the P-type doped region PR. The phrase "the light emitting elements E do not overlap with the photo diodes P" described herein refers to that the top area of the light emitting layer EL and the top area of the P-type doped region PR do not overlap in the normal direction of the surface of the semiconductor substrate 10 or the top view direction (for example, the direction Z) of the electronic device 1.

The second type semiconductors S2 are respectively disposed on the light emitting layers EL, and the light emitting layers EL are disposed between the first type semiconductors S1 and the second type semiconductors S2. For example, the materials of the first type semiconductor S1 and the second type semiconductor S2 are respectively N-type gallium nitride and P-type gallium nitride, but not limited thereto.

According to different requirements, the light emitting module 12 may further include other film layers. For example, the light emitting module 12 may further include one or more first type electrodes E1 (schematically shown as one in FIG. 1A), multiple second type electrodes E2, and a dielectric layer DL4, but not limited thereto.

The first type electrode E1 is disposed on the surface of the first type semiconductor layer S1L facing the semiconductor substrate 10 and is electrically connected to the first type semiconductor layer S1L. The material of the first type electrode E1 may include a metal or a metal laminate, but not limited thereto. In some embodiments, the first type electrode E1 may be bonded to the circuit CK3 through a conductive member (not shown). The conductive member may include a solder, an anisotropic conductive film (ACF), an anisotropic conductive paste (ACP), or other conductive bonding members. The first type semiconductor layer S1L may be electrically connected to a common (com) signal source through the first type electrode E1, the circuit CK3, the circuit CK2, and the circuit CK1, but not limited thereto. In other embodiments, the circuit CK1 and the through hole TH2 may be omitted, and the first type semiconductor layer S1L may be electrically connected to the common signal source through the first type electrode E1, the circuit CK3, and the circuit CK2.

The second type electrodes E2 are respectively disposed on the second type semiconductors S2 and are respectively electrically connected to the second type semiconductors S2. The material of the second type electrode E2 may include a metal or a metal laminate, but not limited thereto. In some embodiments, the second type electrodes E2 may be respectively bonded to the pads P1 through multiple conductive members (not shown). The conductive member may include a solder, an anisotropic conductive film, an anisotropic conductive paste, or other conductive bonding members. The second type semiconductor S2 of each light emitting element E may be electrically connected to the corresponding transistor T through the corresponding second type electrode E2 and pad P1.

The dielectric layer DL4 is disposed on a surface of the first type semiconductor layer S1L away from the light emitting layers EL and fills in the first openings A1. The dielectric layer DL4 may be used to protect the light emitting elements E. In some embodiments, the dielectric layer DL4 may also be used as an optical matching layer. For example, the refractive index of the dielectric layer DL4 may be designed to be greater than the refractive index of air and less than the refractive index of the first type semiconductor layer S1L to reduce the interface reflection/refraction, thereby increasing the amount of light received by the photo diode P. The material of the dielectric layer DL4 may include an inorganic material, such as silicon oxide or silicon nitride, but not limited thereto.

In some embodiments, the electronic device 1 may further include an adhesive layer 14, and the semiconductor substrate 10 and the light emitting module 12 may be fixed together through the adhesive layer 14. The material of the adhesive layer 14 may include, but is not limited to, an optical clear adhesive (OCA) or an optical clear resin (OCR). If the difference between the refractive index of the adhesive layer 14 and the refractive index of the dielectric layer DL3 or the difference between the refractive index of the adhesive layer 14 and the refractive index of the dielectric layer DL4 is designed to be less than 0.5, the reflection of light between the two interfaces can be reduced to increase the amount of light received by the photo diode P.

Through integrating the photo diodes P in the semiconductor substrate 10 and forming the first openings A1 allowing light to pass through in the light emitting module 12, it is not necessary to additionally dispose an optical structure (for example, a light shielding structure or a light collimating structure) corresponding to the photo diodes P above the light emitting module 12, thereby having a relatively simplified manufacturing procedure. In addition, through the design that the light emitting elements E do not overlap with the photo diodes P, the probability that the light emitting elements E shield light reflected from the test specimen back to the photo diodes P can be reduced.

In some embodiments, the electronic device 1 may provide an identity recognition function, such as a fingerprint sensing function, that is, the photo diodes P may be used to sense fingerprints, but not limited thereto. In other embodiments, the photo diodes P may be used to sense palm prints or other biometrics.

In some embodiments, although not shown, the light emitting module may be replaced with other electronic modules, such as a sensing module or an antenna module, but not limited thereto. The electronic module may include multiple electronic elements or multiple semiconductor elements, and the electronic elements or the semiconductor elements are, for example, respectively electrically connected to the transistors T.

Figure 2:
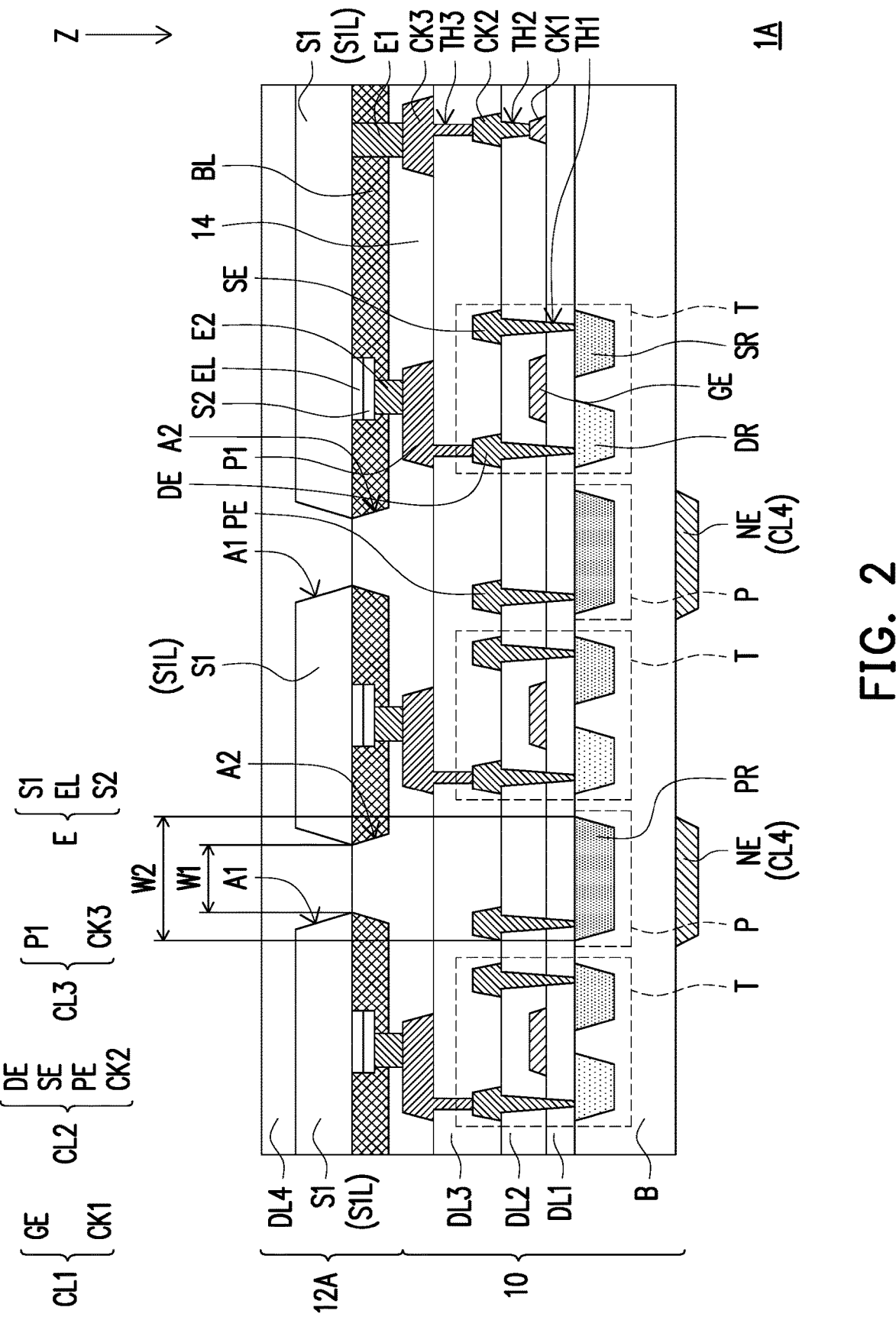
Figure 3:
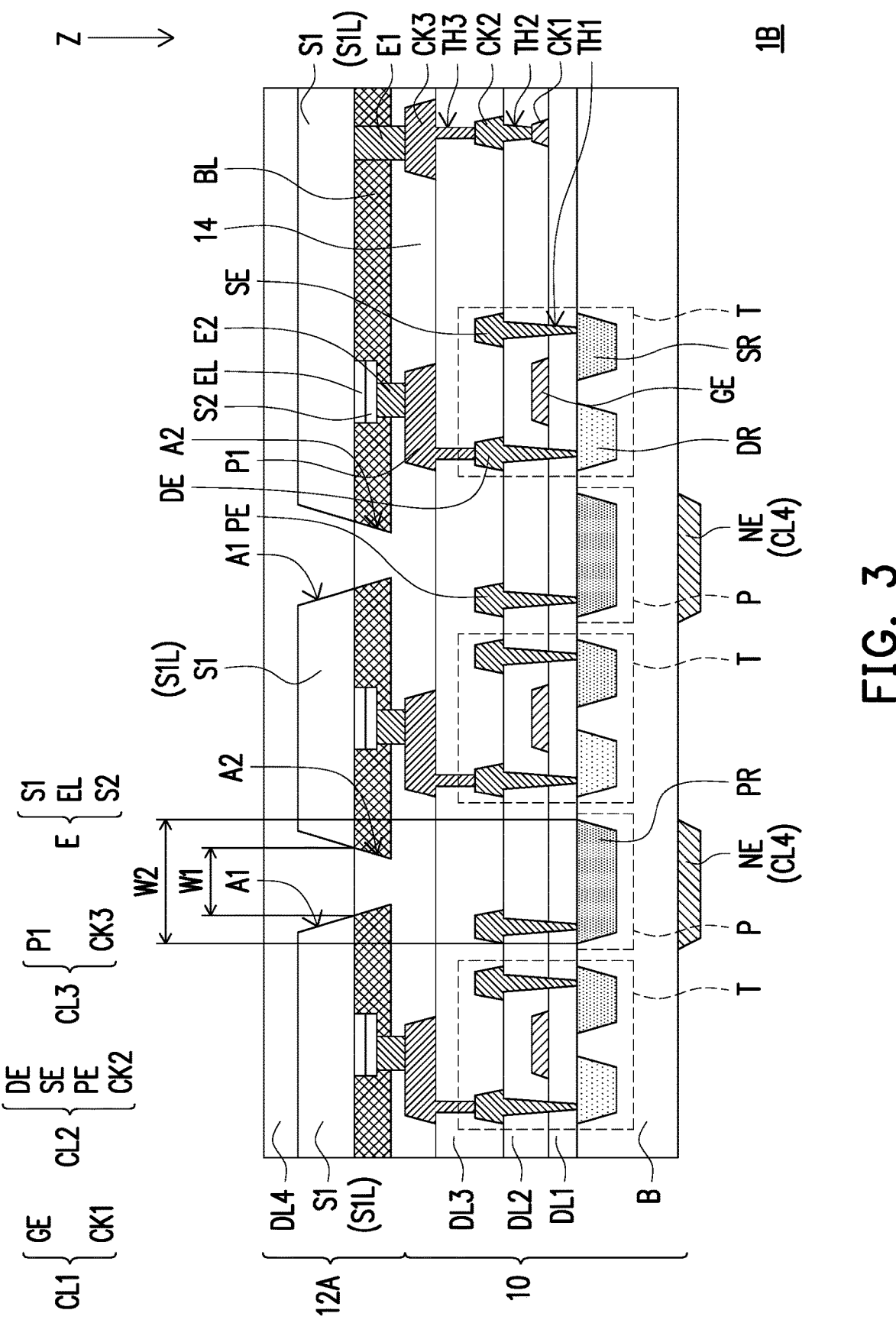

Please refer to FIG. 2 and FIG. 3. The main difference between an electronic device 1A/electronic device 1B and the electronic device 1 in FIG. 1A is that a light emitting module 12A of the electronic device 1A and the electronic device 1B further includes a light shielding layer BL. The light shielding layer BL surrounds each of the light emitting elements E. For example, the light shielding layer BL surrounds at least the light emitting layer EL of each light emitting element E. The light shielding layer BL includes multiple second openings A2. The second openings A2 respectively overlap with the photo diodes P.

In detail, the light shielding layer BL may be used to absorb stray light or filter noise. The material of the light shielding layer BL may include any material that shields light, such as a light absorbing material or a light reflecting material. The light absorbing material may include a black resin, a black ink, or a black photoresist, but not limited thereto. The light reflecting material may include a metal, a white resin, a white ink, or a white photoresist, but not limited thereto. According to different fabrication manners, the second opening A2 may be a through hole with a narrower upper portion and a wider lower portion (as shown in FIG. 2) or a through hole with a wider upper portion and a narrower lower portion (as shown in FIG. 3), but not limited thereto.

Through the design of the narrower upper portion and the wider lower portion of the second opening A2, as shown in FIG. 2, the narrowest portion of the first opening A1 and the narrowest portion of the second opening A2 are formed at a junction of the first opening A1 and the second opening A2, thereby increasing the amount of light received by the photo diode P. On the other hand, through the design of the wider upper portion and the narrower lower portion of the second opening A2, as shown in FIG. 3, the first opening A1 and the second opening A2 are tapered in the direction (for example, the direction Z) approaching the photo diode P, thereby facilitating the filtering of stray light at large angles.

Any embodiment of the disclosure may form the light shielding layer BL as shown in FIG. 2 or FIG. 3, which will not be repeated below.

Figure 4A:
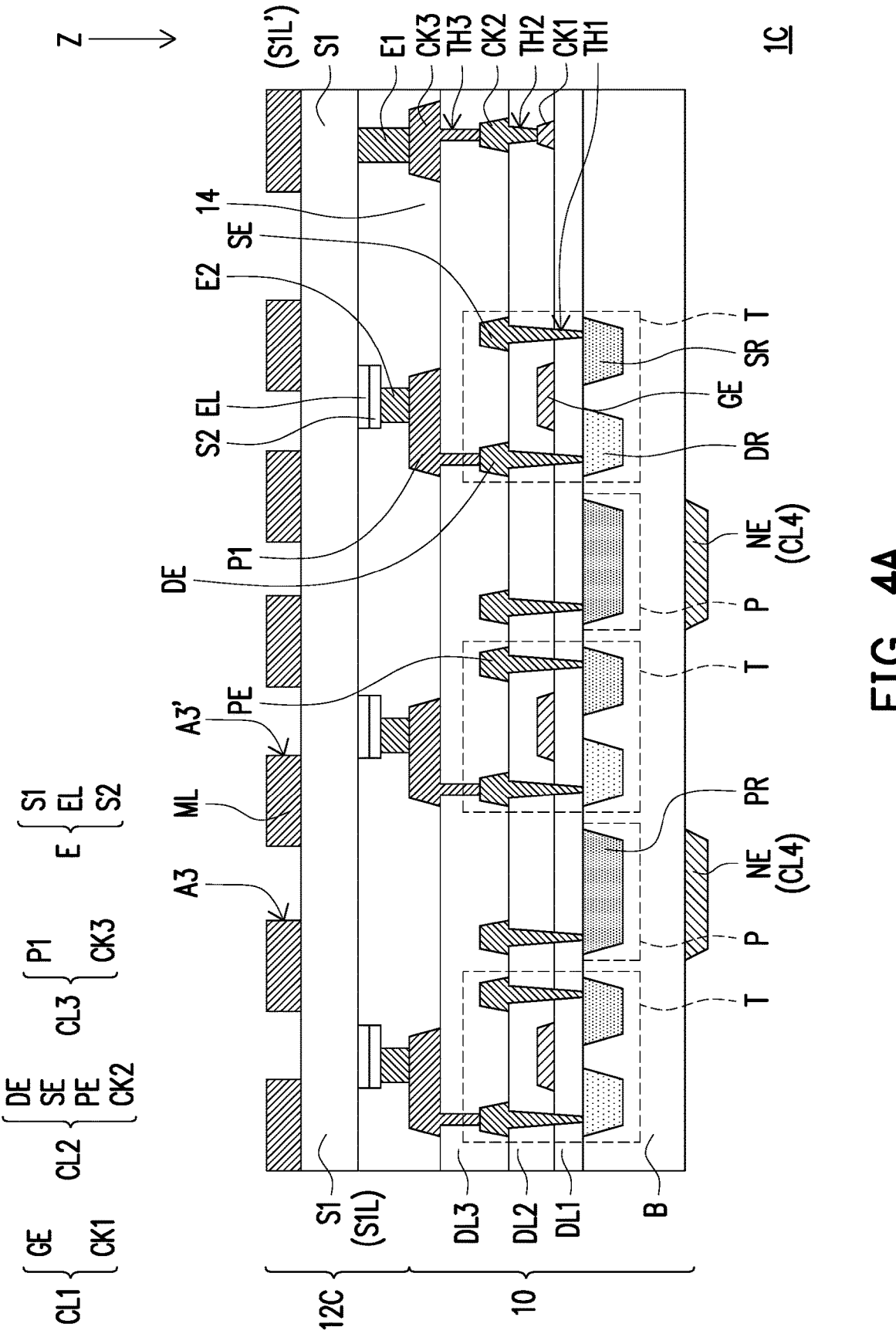
Figure 4B:
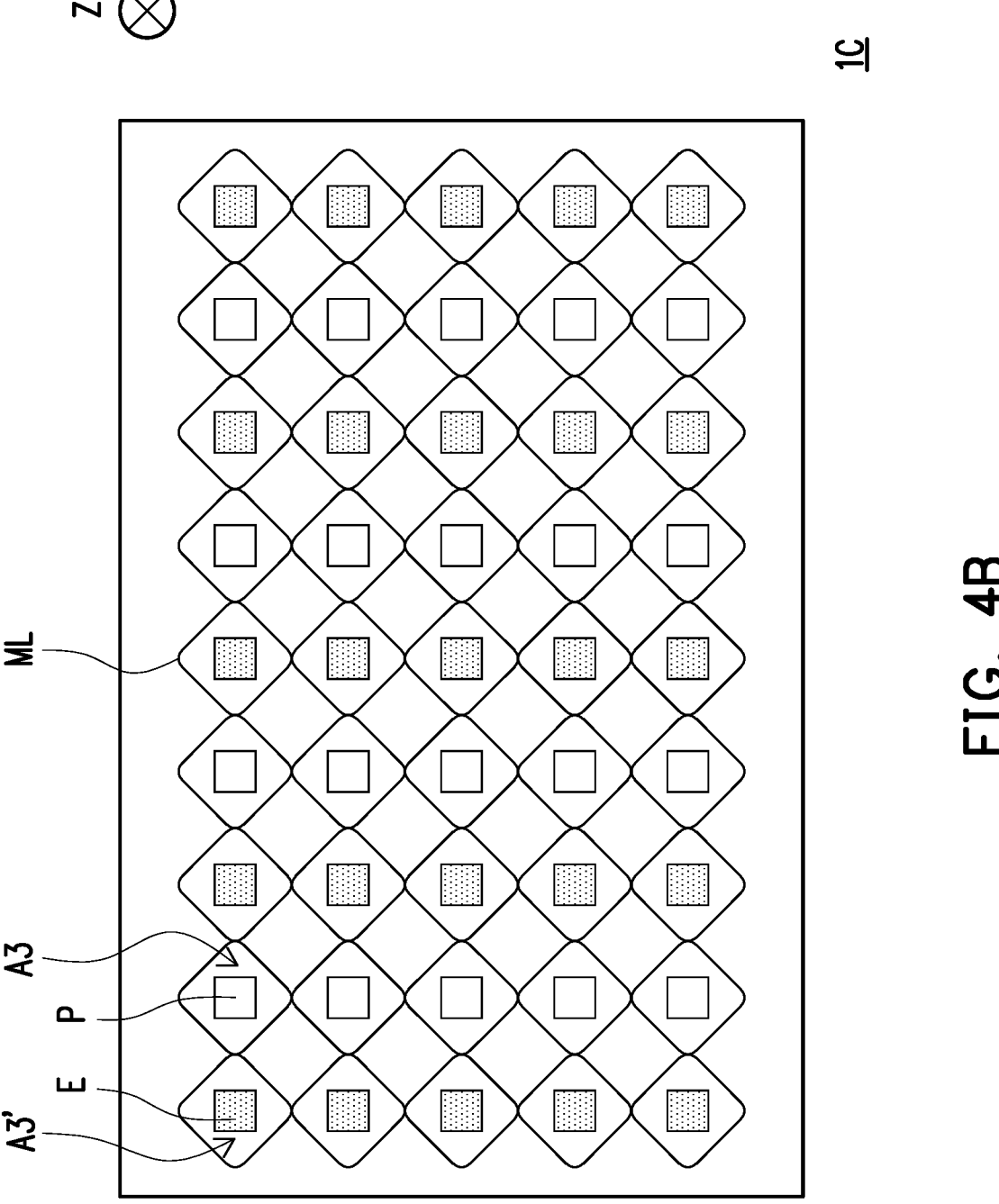
FIG. 4B is a partial top schematic view of the electronic device in FIG. 4A.

Please refer to FIG. 4A and FIG. 4B. The main difference between an electronic device 1C and the electronic device 1 in FIG. 1A is that a light emitting module 12C of the electronic device 1C further includes a conductor layer ML for sensing a touch event. The material of the conductor layer ML may include nano-silver, nano-gold, nano-copper, or other conductor materials. In addition, the conductor layer ML may be formed in a mesh shape to increase light transmittance. For example, the conductor layer ML may include multiple third openings A3. The third openings A3 respectively overlap with the photo diodes P to reduce the probability that the conductor layer ML shields the light reflected from the test specimen back to the photo diodes P. Similarly, the conductor layer ML may further include multiple third openings A3'. The third openings A3' respectively overlap with the light emitting elements E (the light emitting layers EL), so that light emitted by the light emitting elements E can be transmitted to the test specimen (for example, a finger of a user). In other embodiments, the size of the third opening A3 is greater than the size of the third opening A3', so that the photo diodes P can receive more light reflected from the test specimen back to the photo diodes P.

In other embodiments, although not shown, the third opening may overlap with one photo diode P and one light emitting element E. In this way, the third opening A3' may be omitted.

Any embodiment of the disclosure may be changed according to the above (by disposing the conductor layer/metal layer for sensing the touch event), which will not be repeated below.

Figure 5:
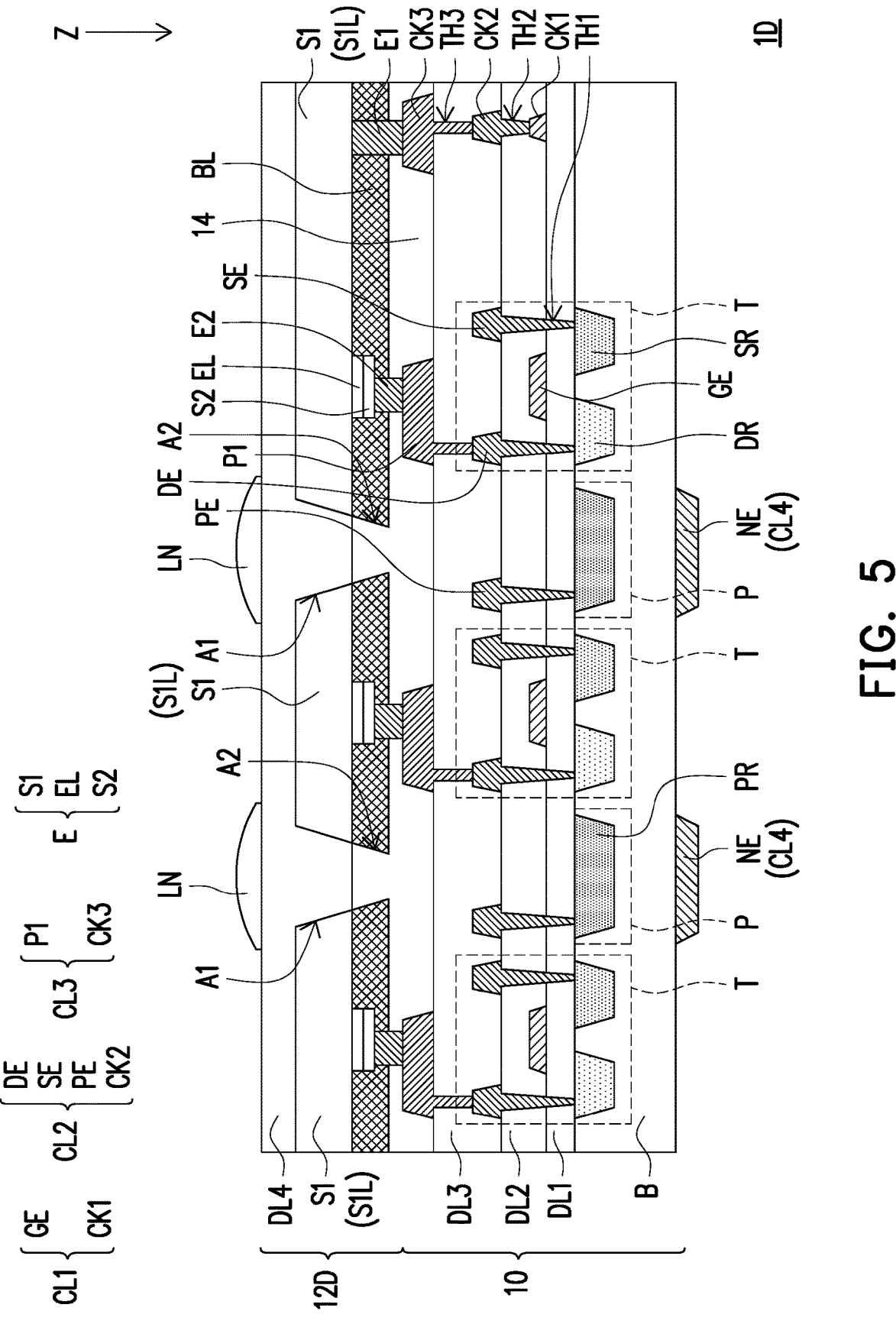

Please refer to FIG. 5. The main difference between an electronic device 1D and the electronic device 1B in FIG. 3 is that a light emitting module 12D of the electronic device 1D further includes multiple lenses LN. In the disclosure, the lens refers to an optical element that can change the travelling direction of a light beam, such as a convex lens or a concave lens.

The lenses LN respectively at least partially overlap with the photo diodes P to converge the light reflected from the test specimen to the photo diodes P. In this way, the light receiving effect can be improved, and the light intensity of the light incident on the photo diodes P can be increased. The form of overlap may be partial overlap or complete overlap. In other embodiments, the lenses LN are disposed on a travelling path of the light reflected from the test specimen back to the photo diodes P. In other embodiments, the lens LN at least partially overlaps with the bottom or the top of the first opening A1. In other embodiments, the lens LN overlaps with the geometric center of the first opening A1. For example, the lens LN may be a focusing lens, such as a plano-convex lens, but not limited thereto. The material of the lens LN may be an organic material or an inorganic material, and the refractive index of the lens LN may be between 1 and 3, but not limited thereto. In addition, when the electronic device 1D includes two different types of photo diodes P in response to various sensing requirements, such as fingerprint recognition and living body recognition, the refractive index and the radius of curvature of the lens LN corresponding to the different types of photo diodes P may be correspondingly adjusted to a suitable specification, so that the electronic device 1D may include two different types of lenses LN with different refractive indices or radii of curvature.

In other embodiments, although not shown, the first opening A1 and the second opening A2 may be changed to gradually increase (that is, the narrower upper portion and the wider lower portion) in the direction (for example, the direction Z) approaching the photo diode P.

Alternatively, the light emitting module 12D of the electronic device 1D may not include the light shielding layer BL. Alternatively, the light shielding layer BL in FIG. 5 may be replaced with the light shielding layer BL in FIG. 2.

Any embodiment of the disclosure may be changed according to the above (by disposing the lenses LN), which will not be repeated below.

Figure 6:
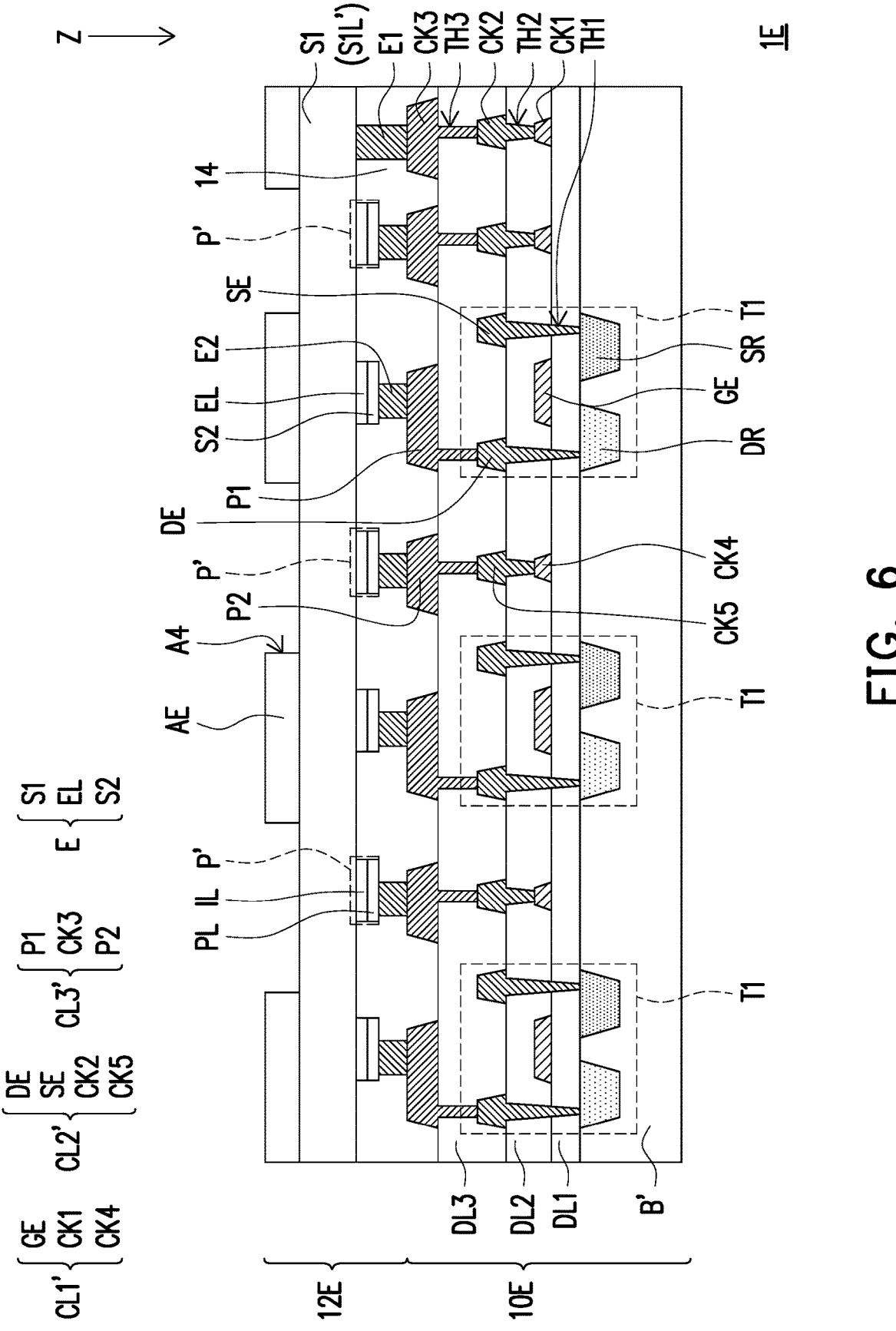

Please refer to FIG. 6. An electronic device 1E includes a semiconductor substrate 10E and a light emitting module 12E. The semiconductor substrate 10E includes multiple first transistors T1. The light emitting module 12E is disposed on the semiconductor substrate 10E and includes multiple light emitting elements E and multiple photo diodes P'. The light emitting elements E are respectively electrically connected to the first transistors T1, and the photo diodes P' do not overlap with the light emitting elements E.

In some embodiments, the semiconductor substrate 10E further includes a base B'. The material of the base B' may include a semiconductor material, such as monocrystalline silicon, polycrystalline silicon, silicon carbide, silicon, germanium, gallium arsenide, indium phosphide, or gallium nitride, but not limited thereto.

The source region SR and the drain region DR may be formed in the base B' through an ion implantation process. FIG. 6 schematically shows three source regions SR and three drain regions DR. However, it should be understood that the respective numbers of the source region SR and the drain region DR in the base B' or the relative configuration relationship of the above elements may be changed according to requirements and is not limited to as shown in FIG. 6.

According to different requirements, the semiconductor substrate 10E may further include other film layers. For example, the semiconductor substrate 10E may further include a dielectric layer DL1, a conductive layer CL1', a dielectric layer DL2, a conductive layer CL2', a dielectric layer DL3, and a conductive layer CL3', but not limited thereto.

The dielectric layer DL1 is disposed on the base B' and covers the source region SR and the drain region DR. The material of the dielectric layer DL1 may include an inorganic material, such as silicon oxide or silicon nitride, but not limited thereto.

The conductive layer CL1' is disposed on the dielectric layer DL1. The material of the conductive layer CL1' may include a metal or a metal laminate, such as aluminum, copper, molybdenum, titanium, or a combination thereof, but not limited thereto. The conductive layer CL1' may be a patterned conductive layer, and the conductive layer CL1 may include the gate GE and other circuits (for example, the circuit CK1 and a circuit CK4), but not limited thereto.

The dielectric layer DL2 is disposed on the dielectric layer DL1 and covers the conductive layer CL1'. The material of the dielectric layer DL2 may include an inorganic material, such as silicon oxide or silicon nitride, but not limited thereto.

The conductive layer CL2' is disposed on the dielectric layer DL2. The material of the conductive layer CL2' may include a metal or a metal laminate, such as aluminum, copper, molybdenum, titanium, or a combination thereof, but not limited thereto. The conductive layer CL2' may be a patterned conductive layer, and the conductive layer CL2' may include the source SE, the drain DE, and other circuits (for example, the circuit CK2 and a circuit CK5), but not limited thereto. The source SE may be electrically connected to the corresponding source region SR through the through hole TH1 penetrating the dielectric layer DL1 and the dielectric layer DL2. The drain DE may be electrically connected to the corresponding drain region DR through the corresponding through hole TH1. The circuit CK2 may be electrically connected to the circuit CK1 through the through hole TH2 penetrating the dielectric layer DL2. The circuit CK5 may be electrically connected to the circuit CK4 through the corresponding through hole TH2. For example, the first transistor T1 may be composed of one source region SR, one drain region DR, one gate GE, one source SE, and one drain DE, but not limited thereto.

The dielectric layer DL3 is disposed on the dielectric layer DL2 and covers the conductive layer CL2'. The material of the dielectric layer DL3 may include an inorganic material, such as silicon oxide or silicon nitride, but not limited thereto.

The conductive layer CL3' is disposed on the dielectric layer DL3. The material of the conductive layer CL3' may include a metal or a metal laminate, such as aluminum, copper, molybdenum, titanium, or a combination thereof, but not limited thereto. The conductive layer CL3' may be a patterned conductive layer, and the conductive layer CL3' may include the pad P1, a pad P2, and other circuits (for example, the circuit CK3), but not limited thereto. The pad P1 may be electrically connected to the corresponding drain DE through the through hole TH3 penetrating the dielectric layer DL3. The pad P2 may be electrically connected to the corresponding circuit CK5 through the corresponding through hole TH3. The circuit CK3 may be electrically connected to the circuit CK2 through the corresponding through hole TH3.

In some embodiments, as shown in FIG. 6, the material of a first type semiconductor layer S1L' may include an N-type semiconductor material, and the photo diode P' may be composed of a P-type semiconductor layer PL, an intrinsic semiconductor layer IL, and a part of the first type semiconductor layer S1L', but not limited thereto. The intrinsic semiconductor layer IL is disposed on a surface of the first type semiconductor layer S1L' facing the semiconductor substrate 10E. The P-type semiconductor layer PL is disposed on the intrinsic semiconductor layer IL, and the intrinsic semiconductor layer IL is located between the first type semiconductor layer S1L' and the P-type semiconductor layer PL. In other embodiments, the area of the intrinsic semiconductor layer IL in the top view direction (parallel to the direction Z) is different from the area of the light emitting layer EL in the top view direction. In other embodiments, the area of the intrinsic semiconductor layer IL in the top view direction (parallel to the direction Z) is greater than the area of the light emitting layer EL in the top view direction.

The second type electrodes E2 are respectively disposed on multiple P-type semiconductor layers PL and multiple second type semiconductor S2, and each second type electrode E2 is electrically connected to one P-type semiconductor layer PL or one second type semiconductor S2. In some embodiments, the second type electrodes E2 may be respectively bonded to multiple pads P1 through multiple conductive members (not shown). The conductive member may include a solder, an anisotropic conductive film, an anisotropic conductive paste, or other conductive bonding members. The second type semiconductor S2 of each light emitting element E may be electrically connected to the corresponding first transistor T1 through the corresponding second type electrode E2 and pad P1. The P-type semiconductor layer PL of each photo diode P' may be electrically connected to a signal source through the corresponding second type electrode E2, pad P2, circuit CK5, and circuit CK4, but not limited thereto. In other embodiments, the circuit CK4 and the corresponding through hole TH2 may be omitted, and the P-type semiconductor layer PL may be electrically connected to the signal source through the corresponding second type electrode E2, pad P2, and circuit CK5.

In some embodiments, in addition to the light emitting elements E and the photo diodes P', the light emitting module 12E may further include an auxiliary electrode AE. The material of the auxiliary electrode AE may include a transparent conductive material, metal, or alloy, but not limited thereto.

Through disposing the auxiliary electrode AE on a surface of the first type semiconductor layer S1L' away from the light emitting layer EL, and the auxiliary electrode AE directly contacting the first type semiconductor layer S1L', the auxiliary electrode AE is electrically connected to the light emitting elements E, which reduces impedance. The auxiliary electrode AE may include multiple fourth openings A4. The fourth openings A4 respectively overlap with the photo diodes P' to reduce the probability that the auxiliary electrode AE shields the light reflected from the test specimen back to the photo diodes P.

Any embodiment of the disclosure may be changed according to the above (by disposing the auxiliary electrode AE and/or forming the photo diode P' in the light emitting module), which will not be repeated below.

Figure 7:
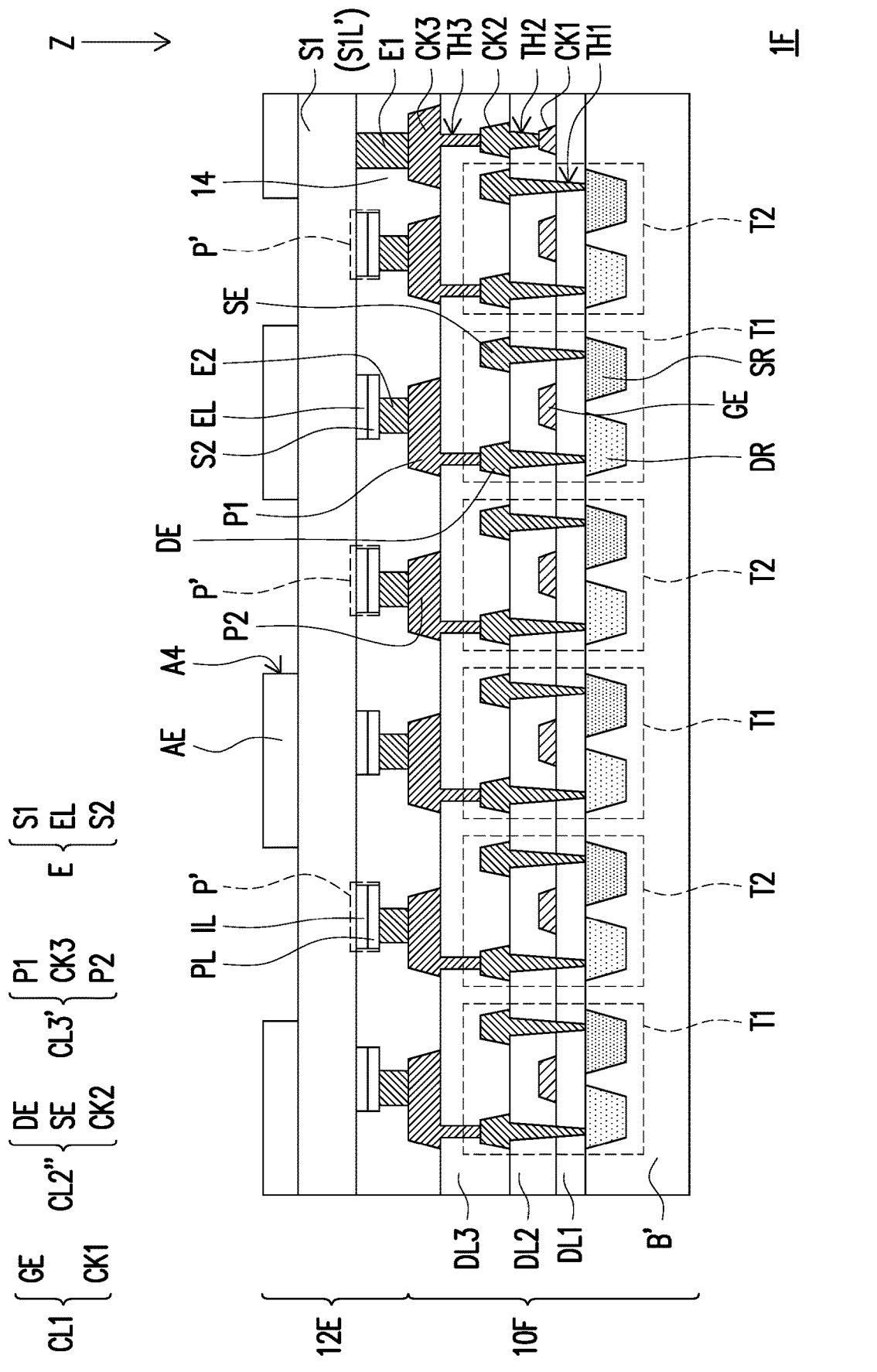

Please refer to FIG. 7. The main difference between an electronic device 1F and the electronic device 1E in FIG. 6 is that a semiconductor substrate 10F of the electronic device 1F further includes multiple second transistors T2, and the second transistors T2 are respectively electrically connected to multiple photo diodes P'. The second transistor T2 may be used as a switch to control the photo diode P'. The composition of the second transistor T2 may be referred to the related description of the first transistor T1, which will not be repeated here.

The circuit CK4 and the circuit CK5 in FIG. 6 are replaced by the second transistor T2, the conductive layer CL1 may not include the circuit CK4, and a conductive layer CL2" may not include the circuit CK5.

Figure 8:
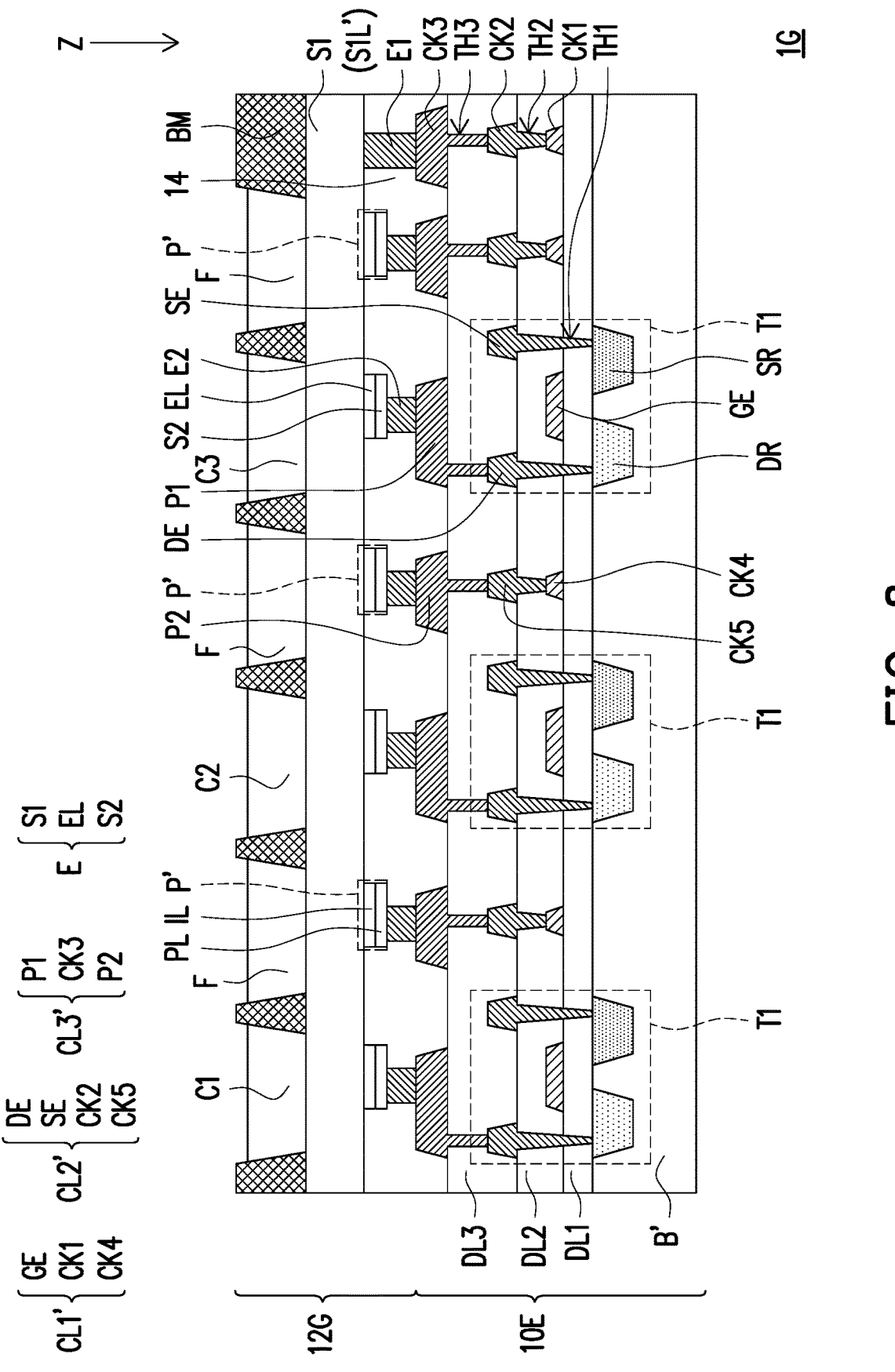

Please refer to FIG. 8. The main difference between an electronic device 1G and the electronic device 1E in FIG. 6 is that a light emitting module 12G of the electronic device 1G does not include the auxiliary electrode AE in FIG. 6, and the light emitting module 12G further includes multiple light conversion patterns (for example, a light conversion pattern C1, a light conversion pattern C2, and a light conversion pattern C3), multiple filter patterns F, and a black matrix BM. The black matrix BM surrounds each of the light conversion patterns and each of the filter patterns F, wherein the light conversion patterns respectively overlap with the light emitting elements E, and the filter patterns F respectively overlap with the photo diodes P'.

In some embodiments, the light emitting elements E may be multiple blue light emitting diodes, and the light conversion pattern C1, the light conversion pattern C2, and the light conversion pattern C3 may respectively be a red light conversion pattern, a green light conversion pattern, and a blue light conversion pattern, but not limited thereto. The material of the light conversion pattern may include fluorescence, phosphorescence, or quantum dots, but not limited thereto. The filter pattern F is, for example, a green filter pattern that allows green light to pass through and filters light of other colors, but not limited thereto. The color type of the filter pattern F may be selected according to the photosensitive waveband of the photo diode P'. In some embodiments, the positions of the photo diode P' and the light emitting element E are deviated from the geometric centers of the corresponding filter pattern F, light conversion pattern C1, light conversion pattern C2, and light conversion pattern C3. Through such configuration, the direction of an outgoing light of the light emitting element E may be adjusted, so that the test specimen is irradiated by the outgoing light in an oblique direction, thereby improving sensing precision.

In other embodiments where the light conversion pattern is not disposed, the light emitting elements E may include light emitting diodes of various colors to implement full-color display, but not limited thereto.

Figure 9:
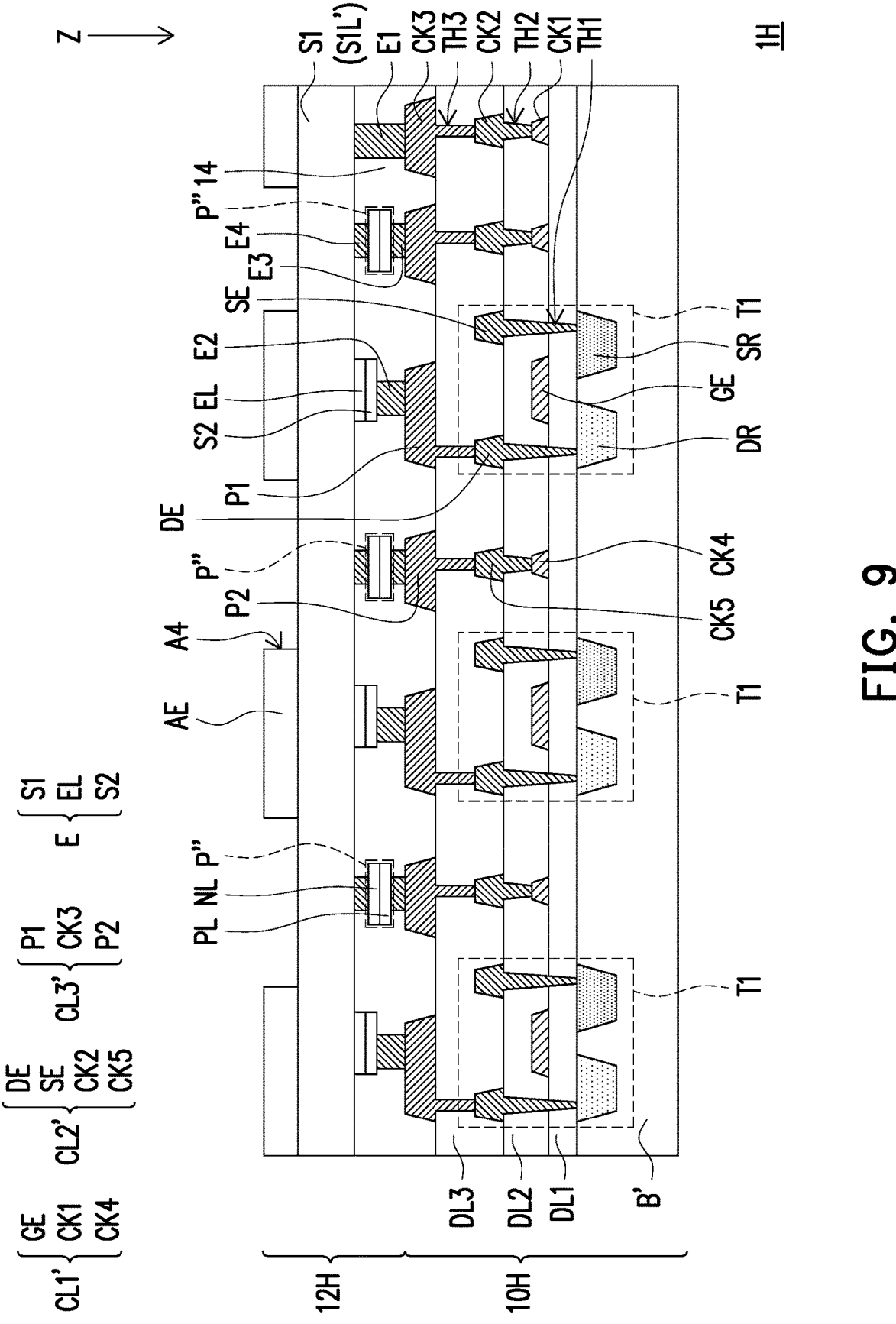

Please refer to FIG. 9. The main difference between an electronic device 1H and the electronic device 1E in FIG. 6 is that multiple photo diodes P" are firstly transferred onto the pads P2, and a semiconductor substrate 10H and a light emitting module 12H are then fixed together through the adhesive layer 14. For example, the photo diode P" may be composed of the P-type semiconductor layer PL and the N-type semiconductor layer NL, wherein the P-type semiconductor layer PL may be electrically connected to the corresponding pad P2 through the electrode E3, and the N-type semiconductor layer NL may be electrically connected to the first type semiconductor layer S1L' through an electrode E4. In some embodiments, the electrode E3 may be bonded to the corresponding pad P2 through a conductive member (not shown), and the electrode E4 may be bonded to a surface of the first type semiconductor layer S1L' facing the semiconductor substrate 10H through a conductive member (not shown). The conductive member may include a solder, an anisotropic conductive film, an anisotropic conductive paste, or other conductive bonding members.

Please refer to FIG. 10A and FIG. 10B. A method of manufacturing an electronic device 1 shown in FIG. 1A may include providing a semiconductor substrate 10. The semiconductor substrate 10 includes multiple transistors T and multiple photo diodes P. In addition, the method of manufacturing the electronic device 1 as shown in FIG. 1A may further include providing a light emitting module 12. The light emitting module 12 includes multiple light emitting elements E. In addition, the method of manufacturing the electronic device 1 as shown in FIG. 1A may further include disposing the light emitting module 12 on the semiconductor substrate 10, so that the light emitting elements E are respectively electrically connected to the transistors T, and the light emitting elements E do not overlap with the photo diodes P.

As shown in FIG. 10A, a light emitting layer EL, a second type semiconductor S2, a second type electrode E2, and a first type electrode E1 may be disposed on a first type semiconductor layer S1L', and the first type semiconductor layer S1L' may then be inverted on the semiconductor substrate 10 and fixed onto the semiconductor substrate 10 through an adhesive layer 14. Next, a first opening A1 may be formed in the first type semiconductor layer S1L' through a drilling process to form a first type semiconductor layer S1L as shown in FIG. 10B. Then, a dielectric layer DL4 is formed on the first type semiconductor layer S1L and in the first opening A1 to complete the fabrication of the electronic device 1.

In some embodiments, as shown in FIG. 11A, a method of providing a light emitting module 12I may include sequentially forming a dielectric layer DL4', the first type semiconductor layer S1L, the light emitting layer EL, the second type semiconductor S2, the second type electrode E2, and the first type electrode E1 on a carrier CR.

Next, as shown in FIG. 11B, a method of manufacturing an electronic device 1I may include removing the carrier CR, inverting the first type semiconductor layer S1L on the semiconductor substrate 10, and fixing the first type semiconductor layer S1L' onto the semiconductor substrate 10 through the adhesive layer 14.

Figure 12B:
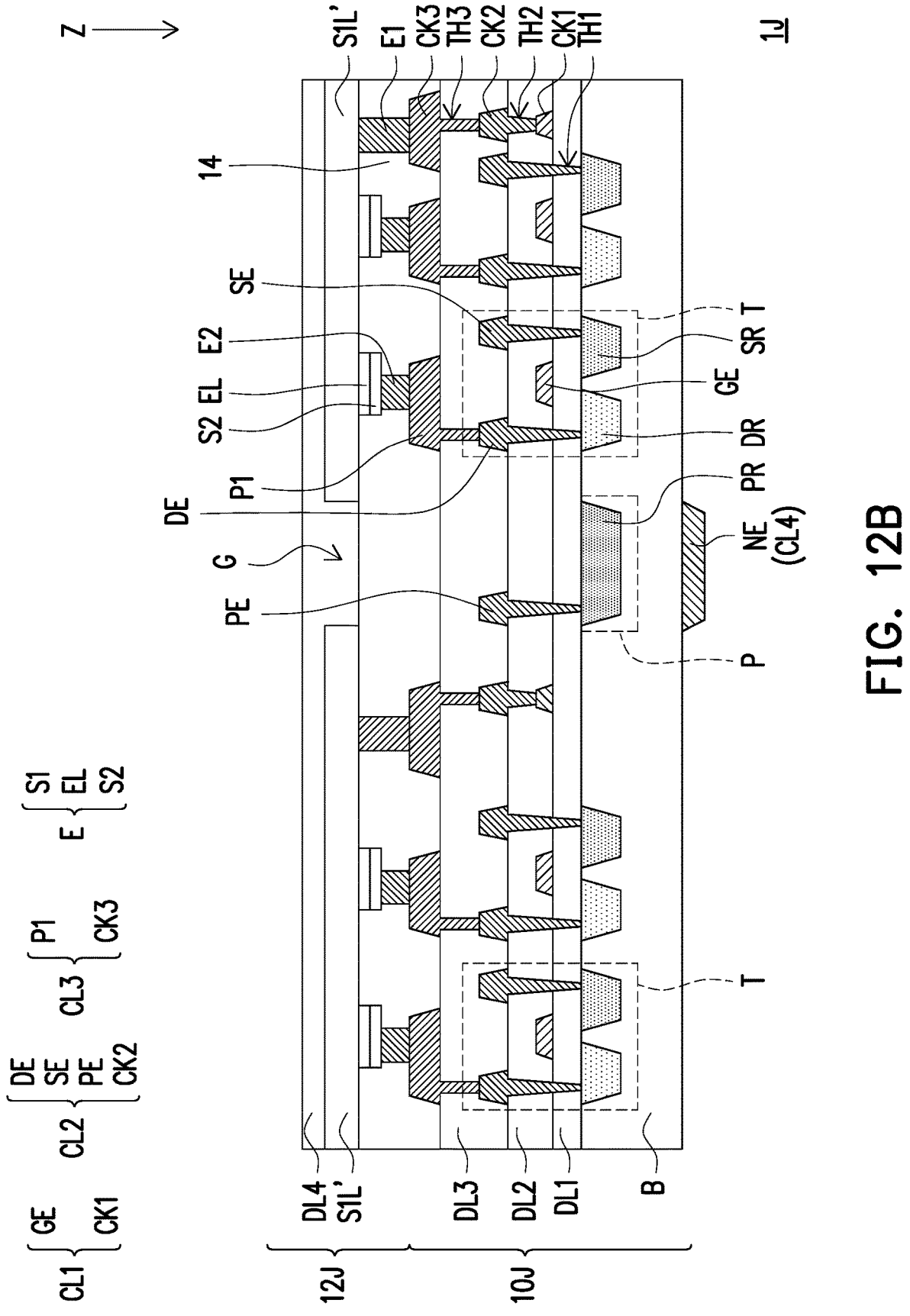

Please refer to FIG. 12A and FIG. 12B. In an electronic device 1J, the top view shape of the semiconductor substrate 10J is, for example, a circle, and the top view shape of a light emitting module 12J is, for example, a quadrangle. However, the top view shapes of the semiconductor substrate 10J and/or the light emitting module 12J may be changed according to requirements, but not limited thereto.

The area of the light emitting module 12J is less than the area of the semiconductor substrate 10J, and multiple light emitting modules 12J are spliced on the semiconductor substrate 10J, wherein the photo diodes P are disposed, for example, corresponding to splicing seams G between the light emitting modules 12J. In this way, it is not necessary to additionally form an opening in the first type semiconductor layer S1L', thereby reducing the probability of damage to the light emitting element E caused by the formation of the opening in the first type semiconductor layer S1L'. In other embodiments, although not shown, the photo diodes P may be more closely or loosely arranged.

Figure 13B:
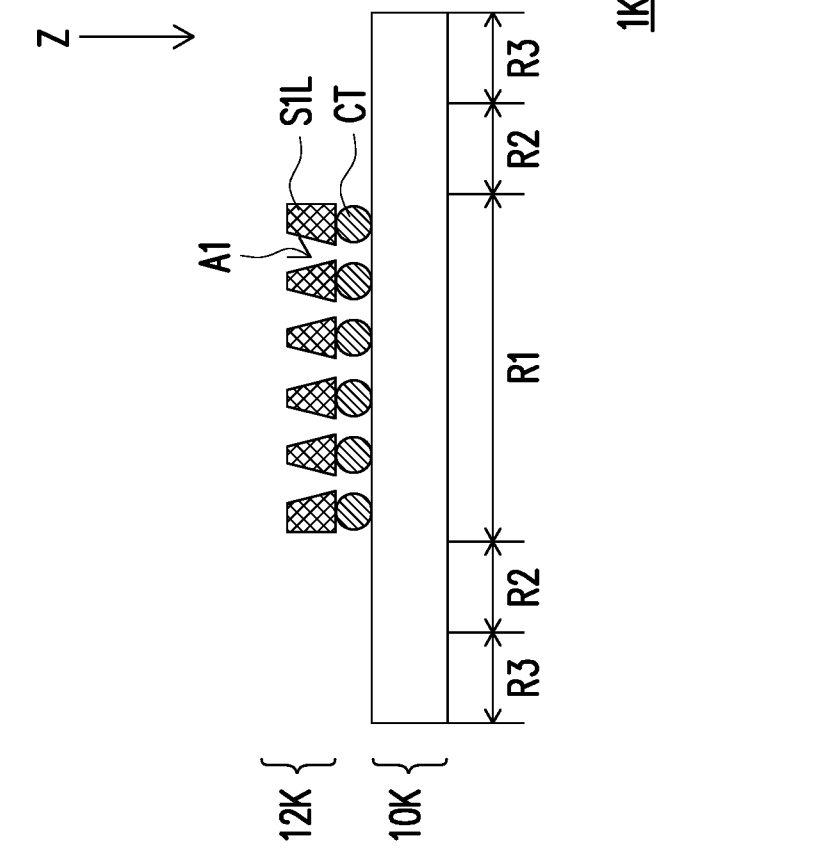
Figure 13A:
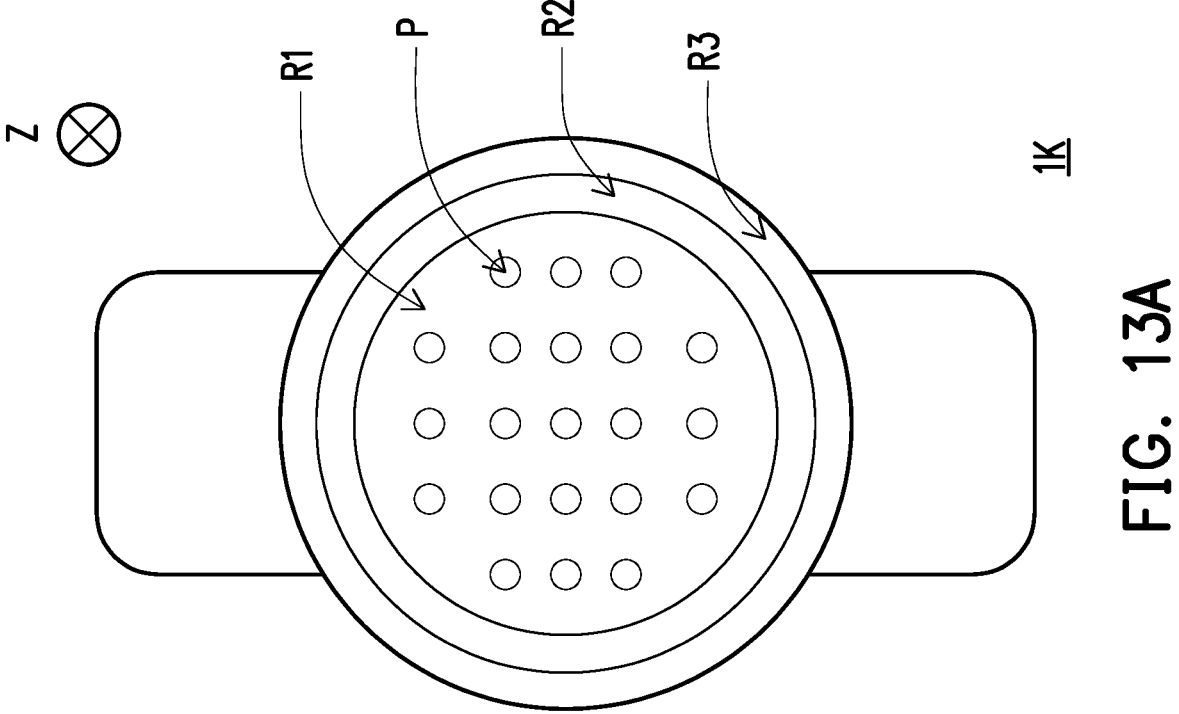
FIG. 13A is a schematic top view of the electronic device in FIG. 13B.

Please refer to FIG. 13A and FIG. 13B. An electronic device 1K is, for example, a wearable device, such as a watch, but not limited thereto. The electronic device 1K may include a first region R1, a second region R2, and a third region R3. The first region R1 is, for example, a region for disposing the opening (for example, the first, second, third, or fourth opening), multiple transistors, multiple photo diodes, and multiple light emitting elements. The second region R2 surrounds the first region R1 and is, for example, a region for disposing a sensor driving circuit (not shown, electrically connected to multiple photo diodes). The third region R3 surrounds the second region R2 and is, for example, a region for disposing a display driving circuit (not shown, electrically connected to multiple light emitting elements). The area of a light emitting module 12K may be less than the area of a semiconductor substrate 10K, and the light emitting module 12K may be bonded to the semiconductor substrate 10K through multiple conductive members CT. The conductive member CT may include a solder, an anisotropic conductive film, an anisotropic conductive paste, or other conductive bonding members.

In other embodiments, although not shown, the sensor driving circuit may be disposed on a carrier (not shown), and the display driving circuit may be disposed on another carrier (not shown). The two carriers may be stacked below the semiconductor substrate 10K to reduce the border width of the electronic device. In addition, when the electronic device includes multiple light emitting modules, the light emitting modules may be staggered on the semiconductor substrate 10K to increase the utilization rate of the substrate.

In the embodiment of the disclosure, through integrating the photo diodes in the semiconductor substrate, and forming the opening that allows light to pass through in the light emitting module, it is not necessary to additionally dispose an optical structure (for example, a light shielding structure or a light collimating structure) corresponding to the photo diodes, thereby having a relatively simplified manufacturing process. In addition, through the design that the light emitting elements do not overlap with the photo diodes, the probability that the light emitting elements shield the light reflected from the test specimen back to the photo diodes can be reduced.

The above embodiments are only used to illustrate, but not to limit, the technical solutions of the disclosure. Although the disclosure has been described in detail with reference to the above embodiments, persons skilled in the art should understand that the technical solutions described in the above embodiments can still be modified, or some or all of the technical features thereof can be equivalently replaced. However, the modifications or replacements do not cause the essence of the corresponding technical solutions to deviate from the scope of the technical solutions of the embodiments of the disclosure.

Although the embodiments of the disclosure and the advantages thereof have been disclosed above, it should be understood that any person skilled in the art can make changes, substitutions, and modifications without departing from the spirit and scope of the disclosure, and the features of the embodiments can be arbitrarily mixed and replaced to form other new embodiments. In addition, the protection scope of the disclosure is not limited to the process, machine, manufacture, material composition, device, method, and steps in the specific embodiments described in the specification. Any person skilled in the art can understand conventional or future-developed processes, machines, manufactures, material compositions, devices, methods, and steps from the content of the disclosure as long as the same can perform substantially the same functions or achieve substantially the same results in the embodiments described herein. Therefore, the protection scope of the disclosure includes the above processes, machines, manufactures, material compositions, devices, methods, and steps. In addition, each claim constitutes a separate embodiment, and the protection scope of the disclosure further includes combinations of the claims and the embodiments. The protection scope of the disclosure should be defined by the appended claims.

What is claimed is:

1. An electronic device, comprising:
   a semiconductor substrate, comprising a plurality of transistors and a plurality of photo diodes; and
   a light emitting module, disposed on the semiconductor substrate and comprising a plurality of light emitting elements, wherein the light emitting elements are respectively electrically connected to the transistors, and the light emitting elements do not overlap with the photo diodes, wherein the light emitting elements comprise a plurality of first type semiconductors, the first type semiconductors are integrated into a first type semiconductor layer, the first type semiconductor layer comprises a plurality of first openings, and the first openings respectively overlap with the photo diodes,
   wherein the first type semiconductor layer partially overlaps with the photo diodes.

2. The electronic device according to claim 1, wherein the light emitting module further comprises a light shielding layer, the light shielding layer surrounds each of the light emitting elements, the light shielding layer comprises a plurality of second openings, and the second openings respectively overlap with the photo diodes.

3. The electronic device according to claim 1, wherein the light emitting module further comprises a plurality of lenses, and the lenses respectively overlap with the photo diodes.

* * * * *